US012690243B2

(12) United States Patent
    Xie et al.

(10) Patent No.:    US 12,690,243 B2
(45) Date of Patent:        Jul. 21, 2026

(54) STACKED FIELD-EFFECT TRANSISTORS HAVING LATCH CROSS-COUPLING CONNECTIONS

(71) Applicant: INTERNATIONAL BUSINESS MACHINES CORPORATION, Armonk, NY (US)

(72) Inventors: Ruilong Xie, Niskayuna, NY (US); Albert M Chu, Nashua, NH (US); Albert M. Young, Fishkill, NY (US); Anthony I. Chou, Guilderland, NY (US); Junli Wang, Slingerlands, NY (US); Brent A Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 764 days.

(21) Appl. No.: 17/722,376

(22) Filed: Apr. 17, 2022

(65) Prior Publication Data

US 2023/0335585 A1     Oct. 19, 2023

(51) Int. Cl.
| | |
|---|---|
| *H10D 62/10* | (2025.01) |
| *H10D 30/01* | (2025.01) |
| *H10D 30/67* | (2025.01) |
| *H10D 64/01* | (2025.01) |
| *H10D 84/01* | (2025.01) |
| *H10D 84/03* | (2025.01) |
| *H10W 20/41* | (2026.01) |
| *H10W 90/00* | (2026.01) |

(52) U.S. Cl.
CPC ......... *H10D 62/118* (2025.01); *H10D 30/031* (2025.01); *H10D 30/6757* (2025.01); *H10D 64/017* (2025.01); *H10D 84/0128* (2025.01);

*H10D 84/038* (2025.01); *H10W 20/435* (2026.01); *H10W 90/00* (2026.01)

(58) Field of Classification Search
CPC ...... H10D 88/00; H10D 84/85; H10D 84/851; H10D 30/501–509; H10D 30/014; H10D 30/031; H10D 30/43; H10D 30/6735; H01L 25/074
See application file for complete search history.

(56) References Cited

U.S. PATENT DOCUMENTS

| | | | |
|---|---|---|---|
| 9,997,598 | B2 | 6/2018 | Smith |
| 10,109,637 | B1 | 10/2018 | Zang et al. |
| 10,192,819 | B1 | 1/2019 | Chanemougame |
| (Continued) | | | |

FOREIGN PATENT DOCUMENTS

| | | |
|---|---|---|
| JP | 2014086125 A | 5/2014 |
| JP | 2019523553 A | 8/2019 |

OTHER PUBLICATIONS

IBM Appendix P, "List of patent and patent applications treated as related", Filed Herewith, 2 pages.
U.S. Appl. No. 17/722,376, filed Apr. 17, 2022.

*Primary Examiner* — Christine S. Kim
*Assistant Examiner* — Andrew Victor Prostor
(74) *Attorney, Agent, or Firm* — David K. Mattheis

(57) ABSTRACT

A semiconductor device including a first pair of stacked transistors having a first upper transistor and a first lower transistor, a second pair of stacked transistors comprising a second upper transistor and a second lower transistor, and a first cross-connection between the first upper transistor and the second lower transistor.

7 Claims, 27 Drawing Sheets

(56)                    References Cited

U.S. PATENT DOCUMENTS

| | | | |
|---|---|---|---|
| 10,418,449 B2 | 9/2019 | Paul | |
| 10,707,218 B2 | 7/2020 | Paul | |
| 10,756,096 B2 | 8/2020 | Paul | |
| 2008/0290380 A1 | 11/2008 | Sheu et al. | |
| 2009/0224330 A1 | 9/2009 | Hong et al. | |
| 2020/0035829 A1 | 1/2020 | Do | |
| 2020/0075574 A1* | 3/2020 | Smith | H10D 84/856 |
| 2020/0177193 A1 | 6/2020 | Schober | |
| 2020/0328127 A1 | 10/2020 | Yamashita et al. | |
| 2020/0411430 A1 | 12/2020 | Mannebach et al. | |
| 2021/0043630 A1 | 2/2021 | Liebmann | |
| 2021/0143159 A1* | 5/2021 | Zhang | H10B 10/12 |
| 2021/0202500 A1 | 7/2021 | Chanemougame | |
| 2022/0181318 A1* | 6/2022 | Liebmann | H10D 84/0186 |
| 2022/0181322 A1* | 6/2022 | Liebmann | H10D 84/856 |
| 2022/0416048 A1* | 12/2022 | Smith | H10D 30/6757 |
| 2023/0343821 A1 | 10/2023 | Xie et al. | |

* cited by examiner

STACKED FIELD-EFFECT TRANSISTORS HAVING LATCH CROSS-COUPLING CONNECTIONS

BACKGROUND

The disclosure relates generally to stacked field effect transistor (FET) devices. The disclosure relates particularly to stacked FET devices having latch cross-coupling connections).

Latch cross-coupling of transistor pairs are often present in circuit designs for information storage and other uses. Implementing the cross-coupling connections in planar arrays of transistors is relatively straightforward.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device includes a first pair of stacked transistors having a first upper transistor and a first lower transistor, a second pair of stacked transistors comprising a second upper transistor and a second lower transistor, and a first cross-connection between the first upper transistor and the second lower transistor.

In one aspect, a method of fabricating a semiconductor device includes cross-connected transistors including forming lower dummy gates with lower gate cut for two lower devices, forming wafer bonding for upper channels, forming upper dummy gates for at least two upper devices, forming at least one opening connecting upper dummy gates and lower dummy gates, forming replacement metal gates, and forming upper gate cuts, wherein a first replacement metal gate connects a first upper device of a first pair of upper and lower devices with a first lower device of a second pair of upper and lower devices.

In one aspect, a method of fabricating a semiconductor device includes cross-connected transistors including forming lower dummy gates with lower gate cut for two lower devices, forming wafer bonding for upper channels, forming upper dummy gates for at least two upper devices, forming at least one opening connecting upper dummy gates and lower dummy gates, forming replacement metal gates, forming upper gate cuts, wherein a first replacement metal gate connects a first upper device of a first pair of upper and lower devices with a first lower device of a second pair of upper and lower devices, and forming back end of line structures adjacent to the replacement metal gate, and a carrier wafer and inverting the formed device.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
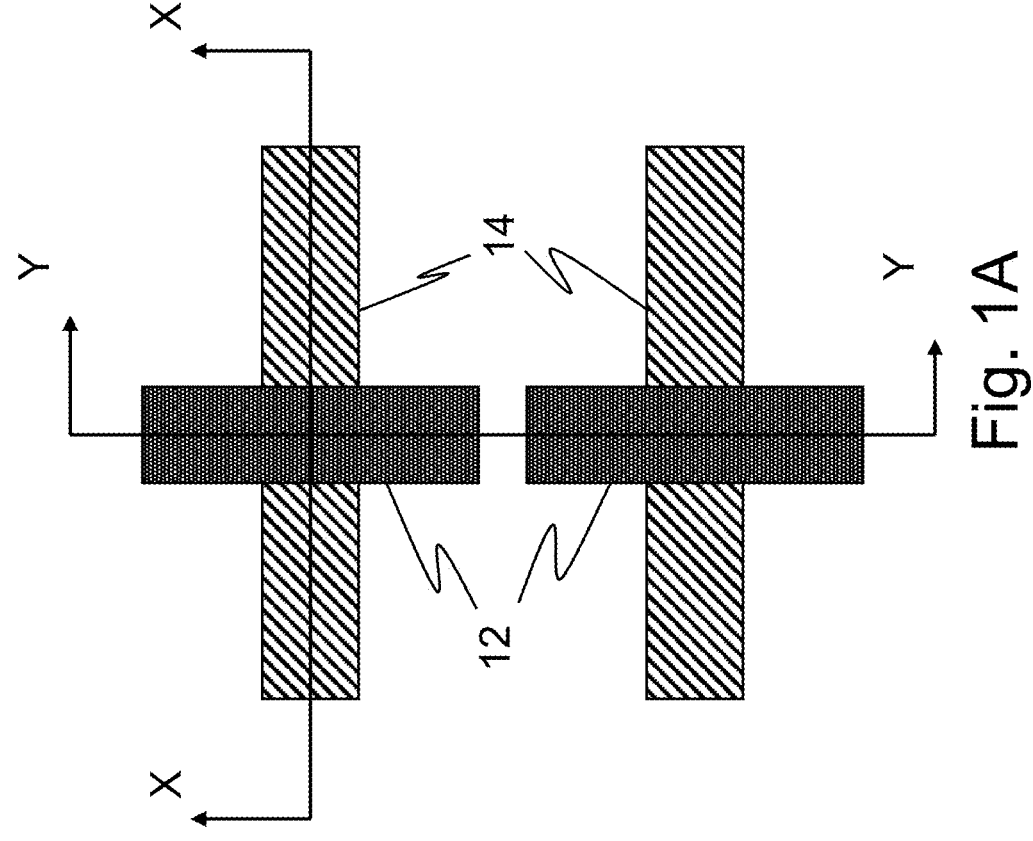
FIG. 1A provides a schematic plan view of device, according to an embodiment of the invention. The figure illustrates the location of the section lines associated with the respective views of FIGS. 1B-25.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

One of the processing complexities of stacked CMOS devices that needs to be addressed at nodes beyond 5 nm is providing final devices having cross-connections enabling the formation of latch circuits. Though such cross-connections may be easily formed for planar arrays of transistors, forming comparable cross-connections for stacked CMOS structure presents a challenge. Disclosed embodiments enable latch circuit designs which incorporate stacked CMOS transistor pairs through integrated device cross-connections between upper and lower transistors of adjacent stacked CMOS pairs.

Reference is now made to the figures. The figures provide schematic cross-sectional illustration of semiconductor devices at intermediate stages of fabrication, according to one or more embodiments of the invention. The figures provide a front cross-section (X) parallel to the nanosheet fins of the device, and side cross-section (Y), parallel to the gate structures of the device. The figures provide schematic representations of the devices of the invention and are not to be considered accurate or limiting with regards to device element scale.

FIG. 1A provides a schematic plan view of a device, according to an embodiment of the invention. As shown in the Figure, gate structures 12, are disposed perpendicular to nanosheet stack fins 14. Section lines X and Y indicate the viewpoints of the respective views of FIGS. 1B-25.

Figure 1B:
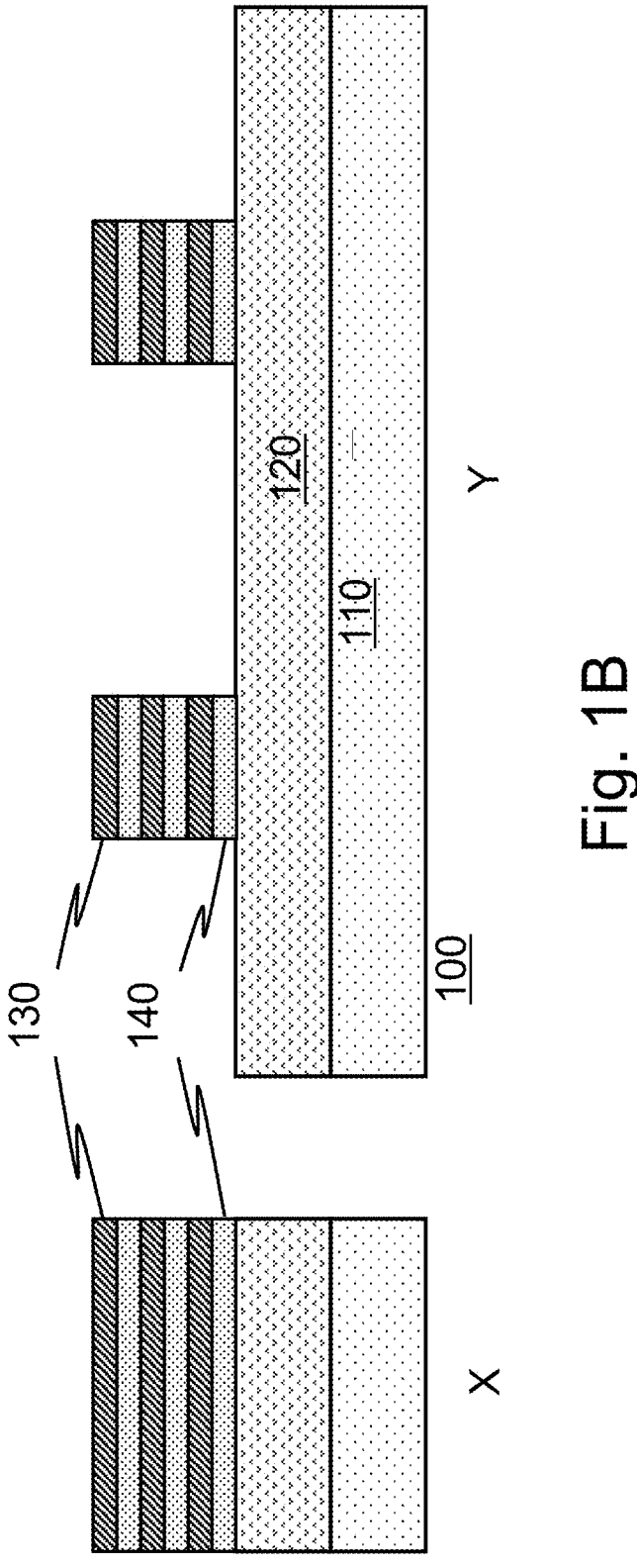
FIG. 1B provides cross-sectional views of a step in the fabrication of a semiconductor device, according to an embodiment of the invention. The figure illustrates a formed and patterned stack of epitaxially grown nanosheet layers.

FIG. 1B provides a schematic view of the device according to an embodiment of the invention following the deposition, patterning, and selective removal of material leaving a stack of layers for the formation of lower device nanosheets. In an embodiment, the stack includes alternating layers of epitaxially grown silicon germanium (SiGe) 140, and silicon 130, disposed upon underlying substrate insulating layer 120, which is in turn, formed upon underlying substrate 110. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack is depicted with six layers (three SiGe layers 140 and three Si layers 130 forming a lower device), however any number and combinations of layers can be used so long as the layers alternate between SiGe and Si to form lower devices. The nanosheet stack is depicted with the layers being in the form of nanosheets, however the width of any given nanosheet layer can be varied so as to result in the form of a nanowire, a nanoellipse, a nanorod, etc. SiGe layers 140, can be composed of, for instance, $SiGe_{20-60}$, examples thereof including, but not limited to $SiGe_{20}$, $SiGe_{25}$, $SiGe_{30}$ . . . $SiGe_{65}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+×2+×3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Insulating layer 120 may be present on substrate 110 and, if present, is located between substrate 110 and the nanosheet stack. Insulating layer 120 can be, for example, a buried oxide layer (typically $SiO_2$) or a bottom dielectric isolation layer formed early in the process (typically SiN, SiBCN, SiOCN, SiOC, or any combination of low-k materials).

In an embodiment, each sacrificial semiconductor material layer 140, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 is composed of a silicon germanium alloy. In an embodiment, the SiGe alloy that provides each sacrificial semiconductor material layer 140 has a germanium content that is less than 50 atomic percent germanium. In one example, the SiGe alloy that provides each sacrificial semiconductor material layer 140 has a germanium content from 20 atomic percent germanium to 40 atomic percent germanium. The first semiconductor material that provides each sacrificial semiconductor material layers 140 can be formed utilizing an epitaxial growth (or deposition process).

Each semiconductor channel material layer 130, is composed of a second semiconductor material that has a different etch rate than the first semiconductor material of the sacrificial semiconductor material layers 140. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, is composed of a silicon germanium alloy. The second semiconductor material of each semiconductor channel material layer 130, can be formed utilizing an epitaxial growth (or deposition process).

Following deposition of the stack of layers 130, and 140, across the surface of the device die, the layers are patterned using a process such as lithographic masking, and selectively etched, yielding a pattern of device fins including stacks of lower device nanosheets separated by sacrificial layers of semiconductor materials. Such stacks define the active regions of the lower devices.

Figure 2:
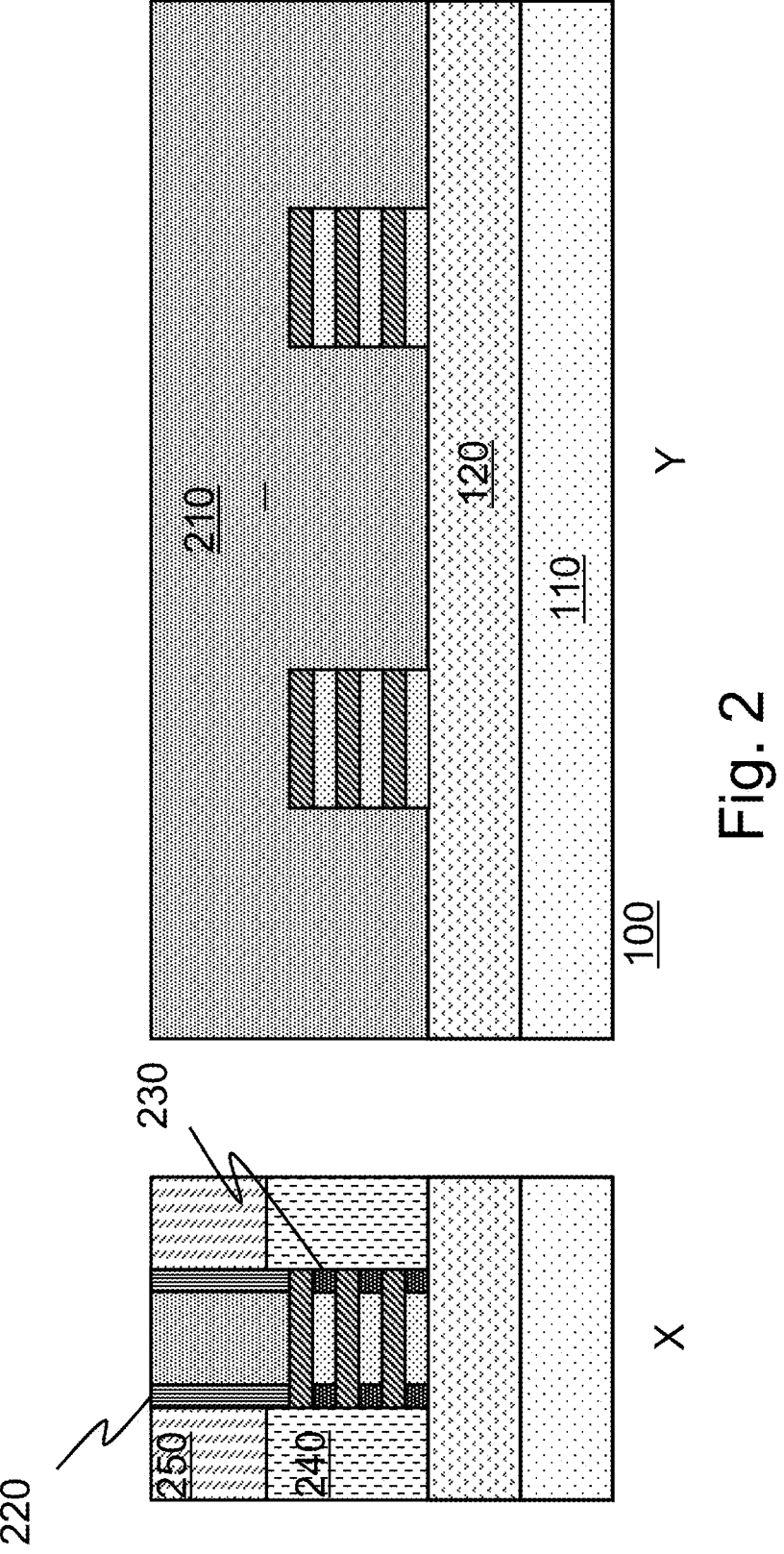
FIG. 2 provides cross-sectional views of a step in the fabrication of a semiconductor device, according to an embodiment of the invention. The figure illustrates the formation of device fins from the stack of nanosheet layers and the formation of source-drain regions and dummy gates.

FIG. 2 illustrates the device following the formation of at least one dummy gate structure on the nanosheet stack. One dummy gate is shown in the Figure; however any number of gates can be formed. Dummy gate structures can be formed by depositing a dummy gate material 210 over the nanosheet stack. The dummy gate material can be, for example, a thin layer of oxide, followed by polycrystalline silicon, amorphous silicon or microcrystal silicon. After that, a hardmask layer (not shown) is deposited over the dummy gate, followed by lithographic patterning, masking, and etching processes yielding the dummy gate structures of the Figure.

In an embodiment, the hardmask includes a nitride, oxide, an oxide-nitride bilayer, or another suitable material. In some embodiments, the hardmask may include an oxide such as silicon oxide (SiO), a nitride such as silicon nitride (SiN), an oxynitride such as silicon oxynitride (SiON), combinations thereof, etc. In some embodiments, the hardmask is a silicon nitride such as $Si_3N_4$.

FIG. 2 further illustrates the device following conformal deposition of low-k dielectric spacer materials 220, to form sidewall spacers along the sidewalls of dummy gate structure 210. In an embodiment, spacer material 220 may be the same material as hardmask or may be different materials and may be comprised of any one or more of a variety of different insulative materials, such as $Si_3N_4$, SiBCN, SiNC, SiN, SiCO, $SiO_2$, SiNOC, etc.

FIG. 2 further illustrates the device after selective removal of spacer sidewall materials 220 from the horizontal surfaces of the dummy gate hard mask. In an embodiment, anisotropic etching is used to selectively remove the horizontal surfaces of the dummy gate hard mask. FIG. 2 further illustrates the device following recessing the nanosheet stack layers 130, 140, and spacer layer 220, to form the S/D cavities for lower devices. FIG. 2 further illustrates the device following formation of inner spacers 230 between nanosheets 130 of the respective FET devices. Portions of nanosheet stack layers 130 and 140, which are not underneath gate spacers 220, and not underneath dummy gate 210, are removed through etching.

Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

After generally etching the nanosheet stack between the dummy gate structures to the upper surface of the dielectric isolation layer 220, a selective etching of SiGe layers 140 of the nanosheet stack removes portions which are underneath gate spacers 220. Inner spacers 230 are then formed in etched-away portions, and thus are located under gate spacers 220. Inner spacers 230 can be composed of any suitable dielectric material, for example $Si_3N_4$, SiBCN, SiNC, SiN, SiCO, $SiO_2$, SiNOC, etc. The inner spacers are formed by a conformal dielectric liner deposition followed by isotropic etching back, so dielectric liner is removed everywhere except the regions pinched-off in those under spacer cavities.

FIG. 2 further illustrates the device following epitaxial growth of source/drain regions 240, for the lower FET device of the stacked CMOS. In an embodiment, pairs of lower epitaxial source/drain regions are formed on opposing sides of nanosheet stacks and dummy gate structures. In an embodiment, boron doped SiGe (SiGe:B) is epitaxially grown from exposed semiconductor surfaces (layer 130) for the formation of p-type FET device on the bottom.

In the present embodiments, the source/drain regions 240 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. In an embodiment, the upper S/D regions of the device comprise n-type material and the lower regions comprise p-type materials. In an embodiment, the upper S/D regions comprise p-type materials and the lower regions comprise n-type materials.

FIG. 2 further illustrates the device following deposition, and planarization of a interlayer dielectric (ILD)layer 250, composed of any suitable dielectric material, for example $Si_3N_4$, SiBCN, SiNC, SiN, SiCO, $SiO_2$, SiNOC, etc. This can be achieved by a deposition of dielectric material 250 to pinch-off the gate-to-gate space then followed by a chemical mechanical planarization (CMP) to a desired upper surface height for the ILD 250.

Figure 3:
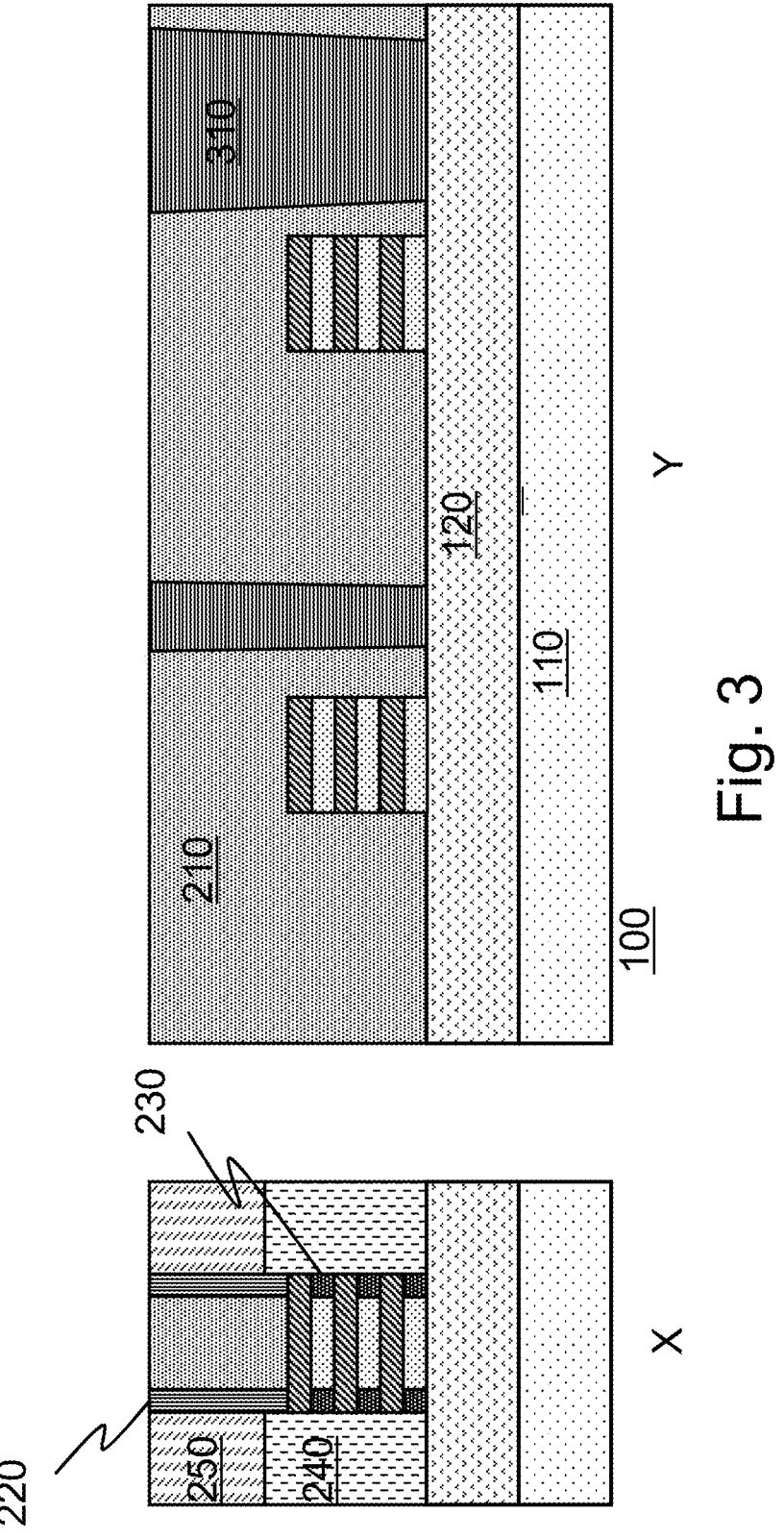
FIG. 3 provides cross-sectional views of a step in the fabrication of a semiconductor device, according to an embodiment of the invention. The figure illustrates formation of gate cuts.

FIG. 3 illustrates device 100 following the formation of a number of gate cut vias through the dummy gate structure followed by filling the vias with a dielectric material. The gate cuts separate lower FET devices from each other and serve a placeholder for future device contacts.

Figure 4:
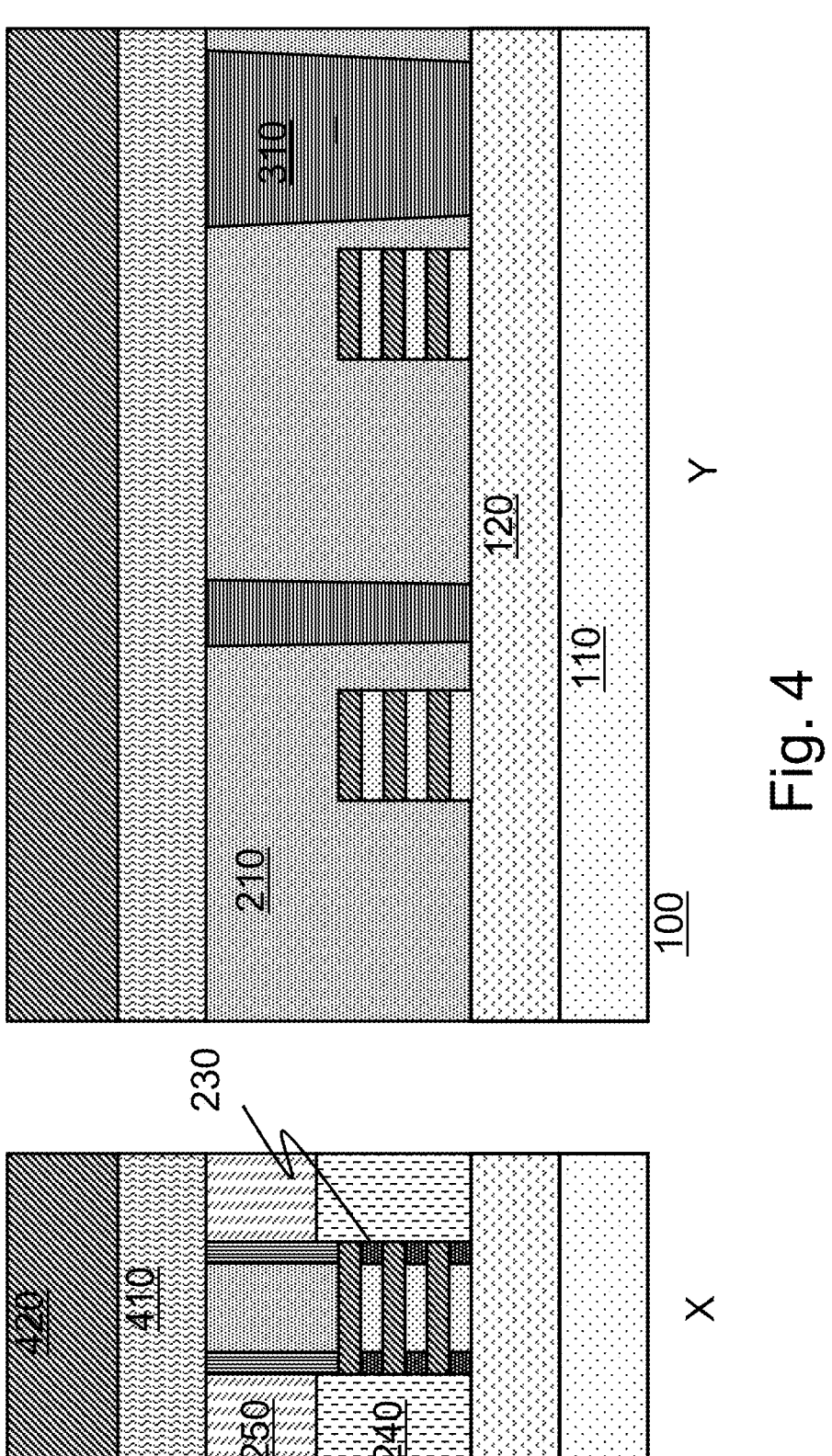
FIG. 4 provides cross-sectional views of a step in the fabrication of a semiconductor device, according to an embodiment of the invention. The figure illustrates the device after the formation of a binding dielectric layer and an upper device semiconductor channel layer.

FIG. 4 illustrates device 100 following deposition of top semiconductor channel 130 through a wafer bonding process. A new silicon wafer can be bonded to the structure shown in FIG. 3 through dielectric-to-dielectric bonding process, such as oxide-to-oxide bonding (with bonding oxide 410), followed by Si thinning process, to form remaining semiconductor channel layer 130.

Figure 5:
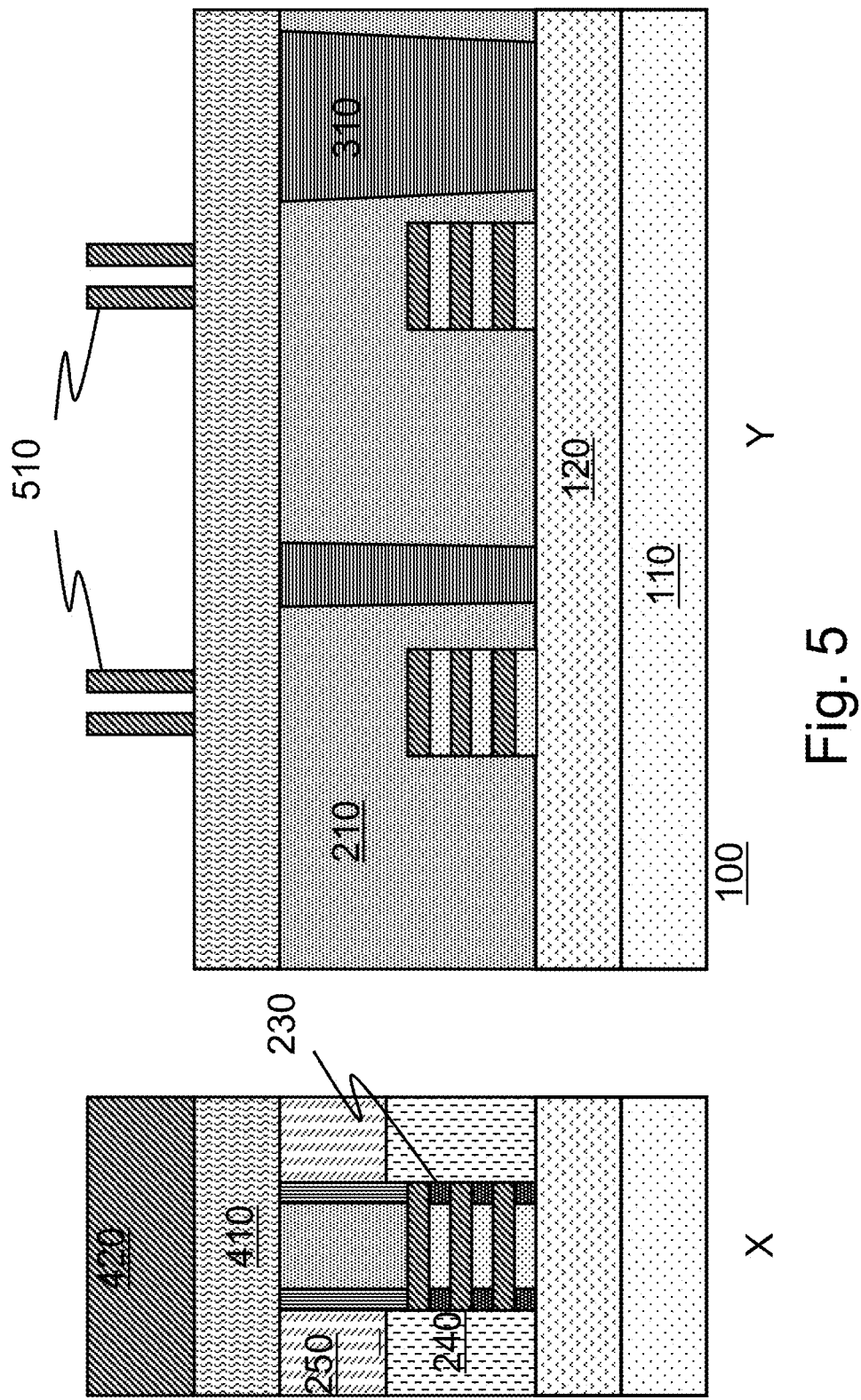
FIG. 5 provides cross-sectional views, of a step in the fabrication of a semiconductor device, according to an embodiment of the invention. The figure illustrates the device after the formation of upper device fins.

FIG. 5 illustrates device 100 following lithographic patterning and etching of semiconductor layer 420, forming vertical fins 510, for upper FET devices of the stacked CMOS pairs.

Figure 6:
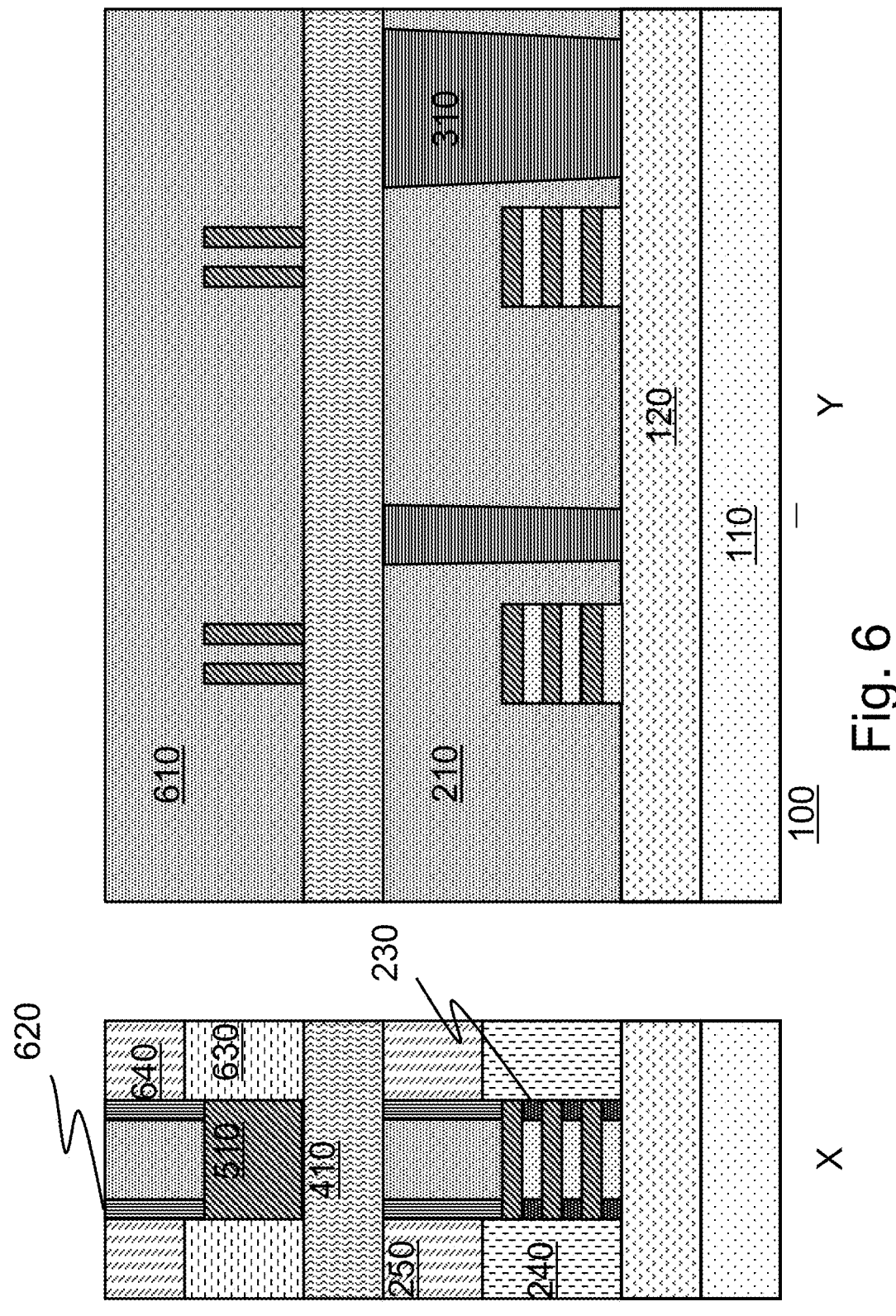
FIG. 6 provides cross-sectional views of a step in the fabrication of a semiconductor device, according to an embodiment of the invention. The figure illustrates the device after the formation of upper device source-drain regions and dummy gates.

FIG. 6 illustrates device 100 following the formation of dummy gate structures 610, and sidewall spacers 620, similar to the fabrication of such lower device structures as described with respect to FIG. 2 above. FIG. 6 further illustrates the device following epitaxial growth of upper FET source/drain regions 630 in a manner similar to that used for the formation of lower FET source/drain regions 240. In an embodiment, the lower device FETs comprise n-type devices and the upper FETs comprise p-type devices. This should not be construed as limiting the invention as the lower devices may comprise n-type devices and the upper FETs may comprise p-type devices. In an embodiment, each set of upper or lower devices comprise a single polarity (n-type or p-type) with the other set comprising the opposite polarity.

Figure 7:
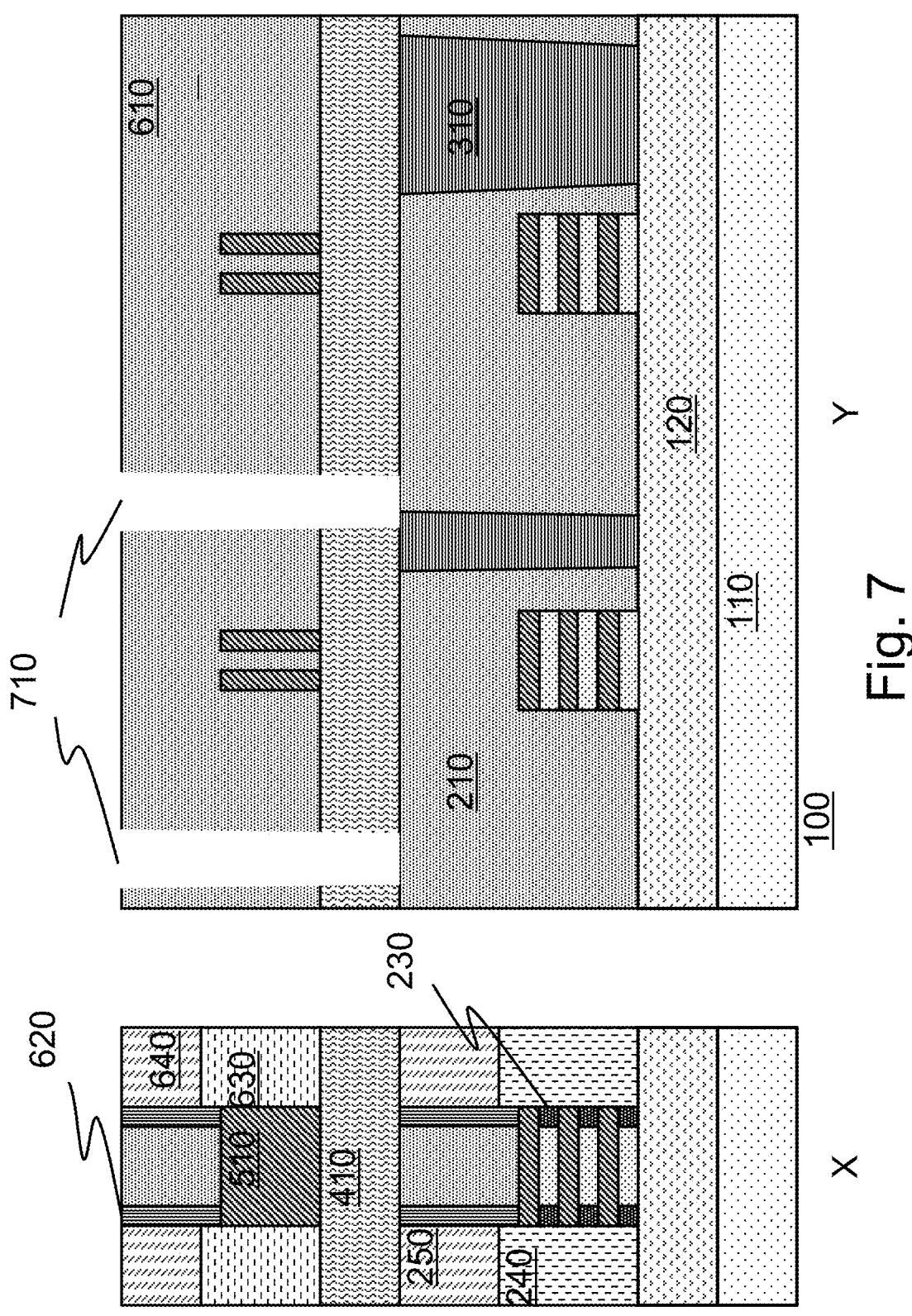
FIG. 7 provides cross-sectional views of a step in the fabrication of a semiconductor device, according to an embodiment of the invention. The figure illustrates the device after the formation of upper-lower device gate cuts.

FIG. 7 illustrates device 100 following the formation of gate openings 710 through inter-stack bonding layer 410, enabling future cross-connections between upper and lower devices of adjacent CMOS stacks.

Figure 8:
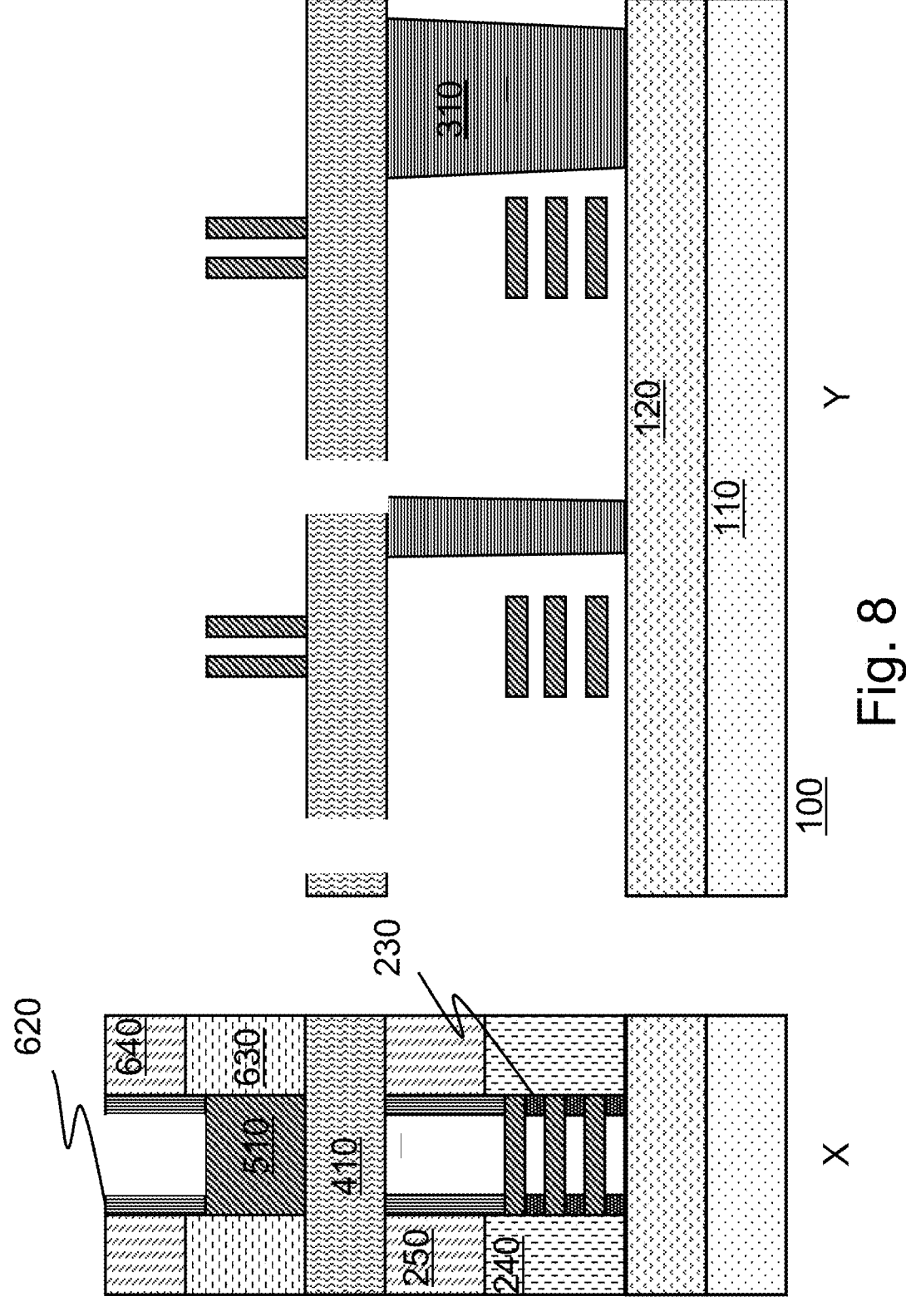
FIG. 8 provides cross-sectional views of a step in the fabrication of a semiconductor device, according to an embodiment of the invention. The figure illustrates the device after the release and removal of dummy gate materials.

FIG. 8 illustrates device 100 following selective removal of lower and upper dummy gate materials 210 and 610 using a wet etch of the materials, followed by removal of exposed sacrificial SiGe layers 140. Lower gate cuts 310 remain after the selective removal.

Figure 9:
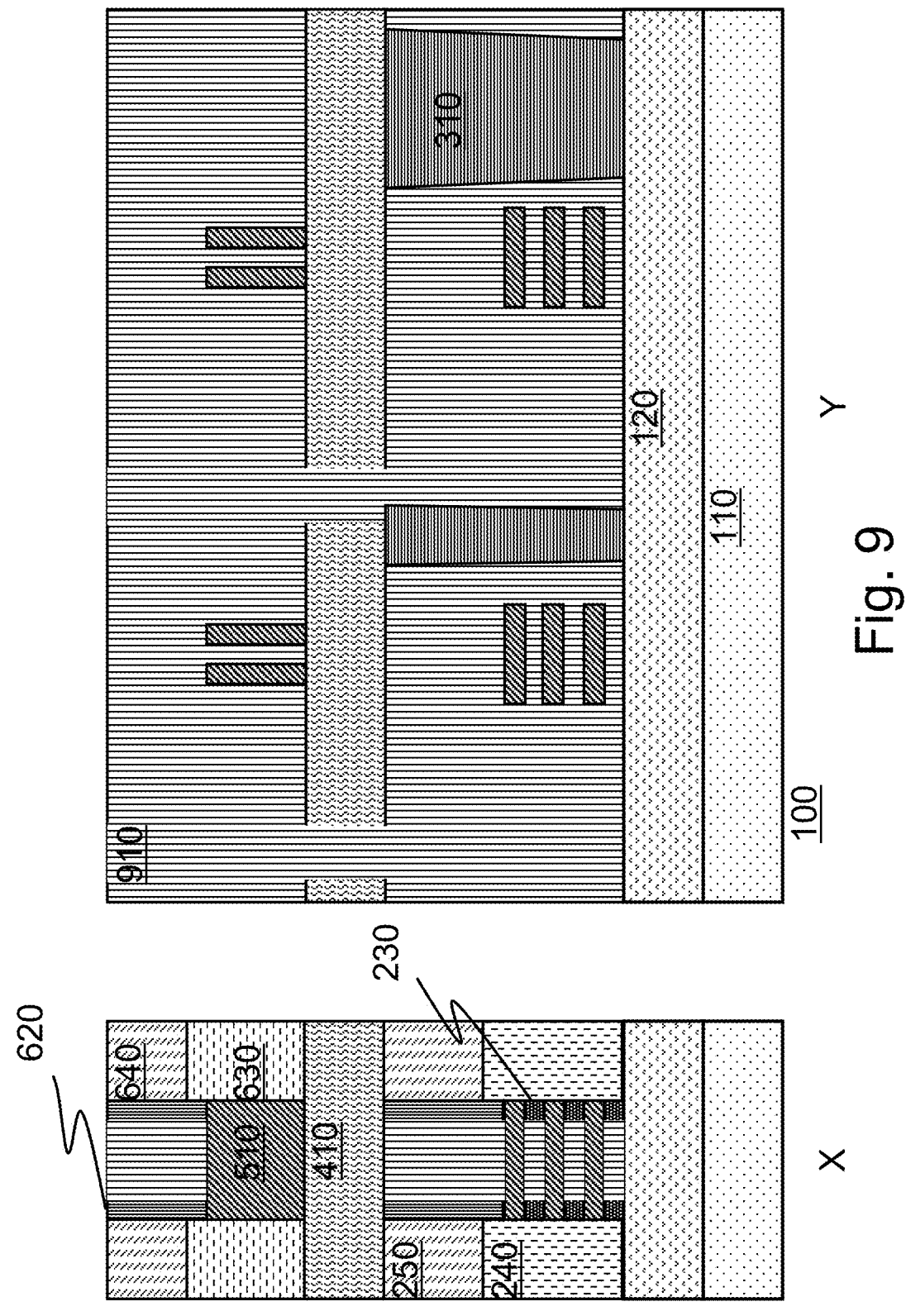
FIG. 9 provides cross-sectional views of a step in the fabrication of a semiconductor device, according to an embodiment of the invention. The figure illustrates the device after formation of high-k replacement metal gates.

FIG. 9 illustrates device 100 following the formation of the high-k metal gate (HKMG) stack. As shown in the Figure, a replacement metal gate structure has been formed in the void space created by removal of the spacer material 210, 610. Gate structure 910 includes gate dielectric and gate metal layers. The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gates can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a CMP process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). The term work function metal includes a single metal layer as well as a stack of metal layers, or surface dipoles combined with a single or stack of metal layers. After formation and CMP of the HKMG, the HKMG can be optionally recessed followed by a deposition and CMP of a gate cap dielectric material (not shown), such as SiN, or similar materials, completing the replacement metal gate fabrication stage for the device.

Figure 10:
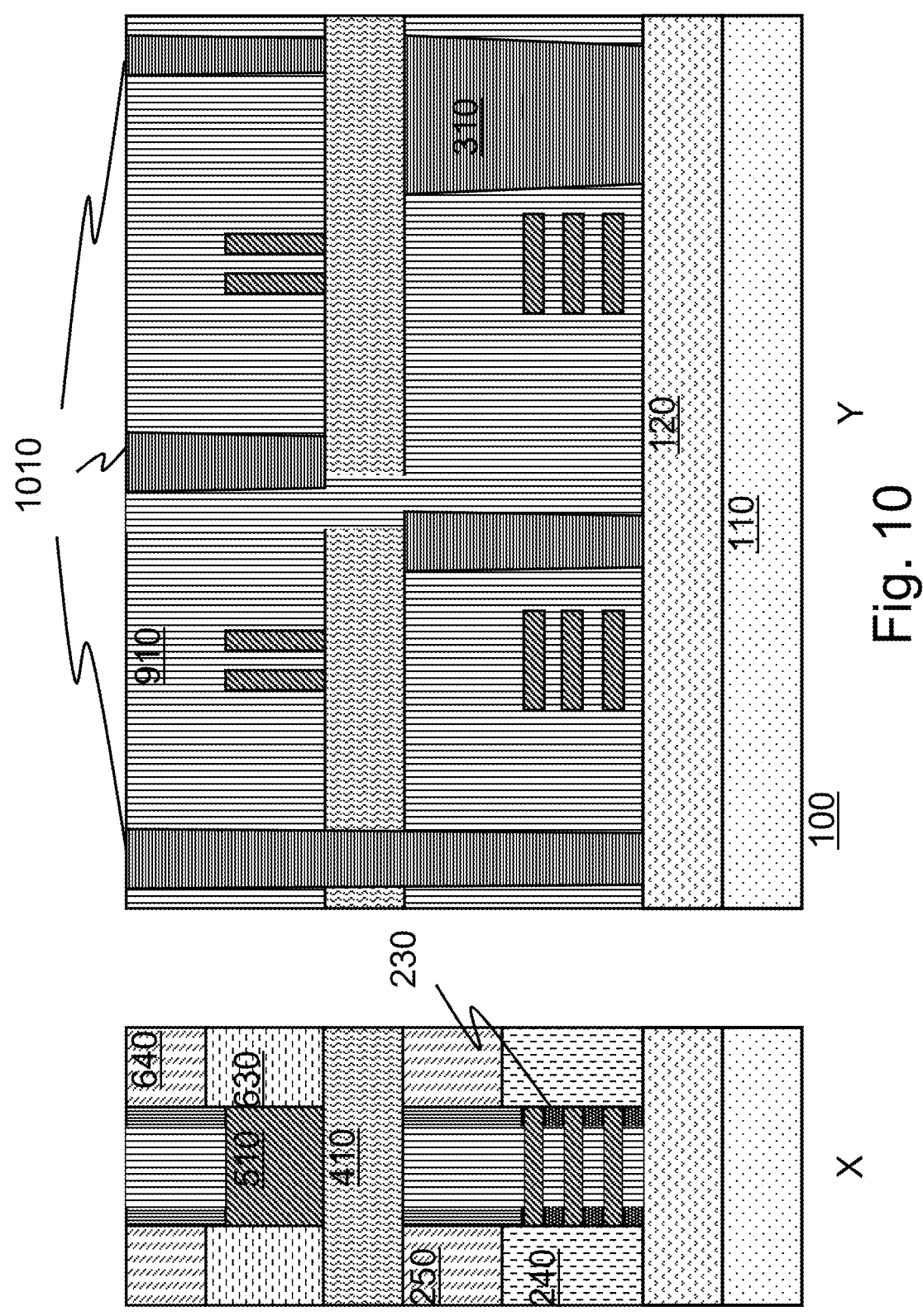
FIG. 10 provides cross-sectional views of a step in the fabrication of a semiconductor device, according to an embodiment of the invention. The figure illustrates the device after formation of upper-lower device gate cuts.

FIG. 10 illustrates device 100 following the formation and backfilling of additional gate cuts 1010, isolating upper FET devices and providing access to lower FET devices.

Figure 11:
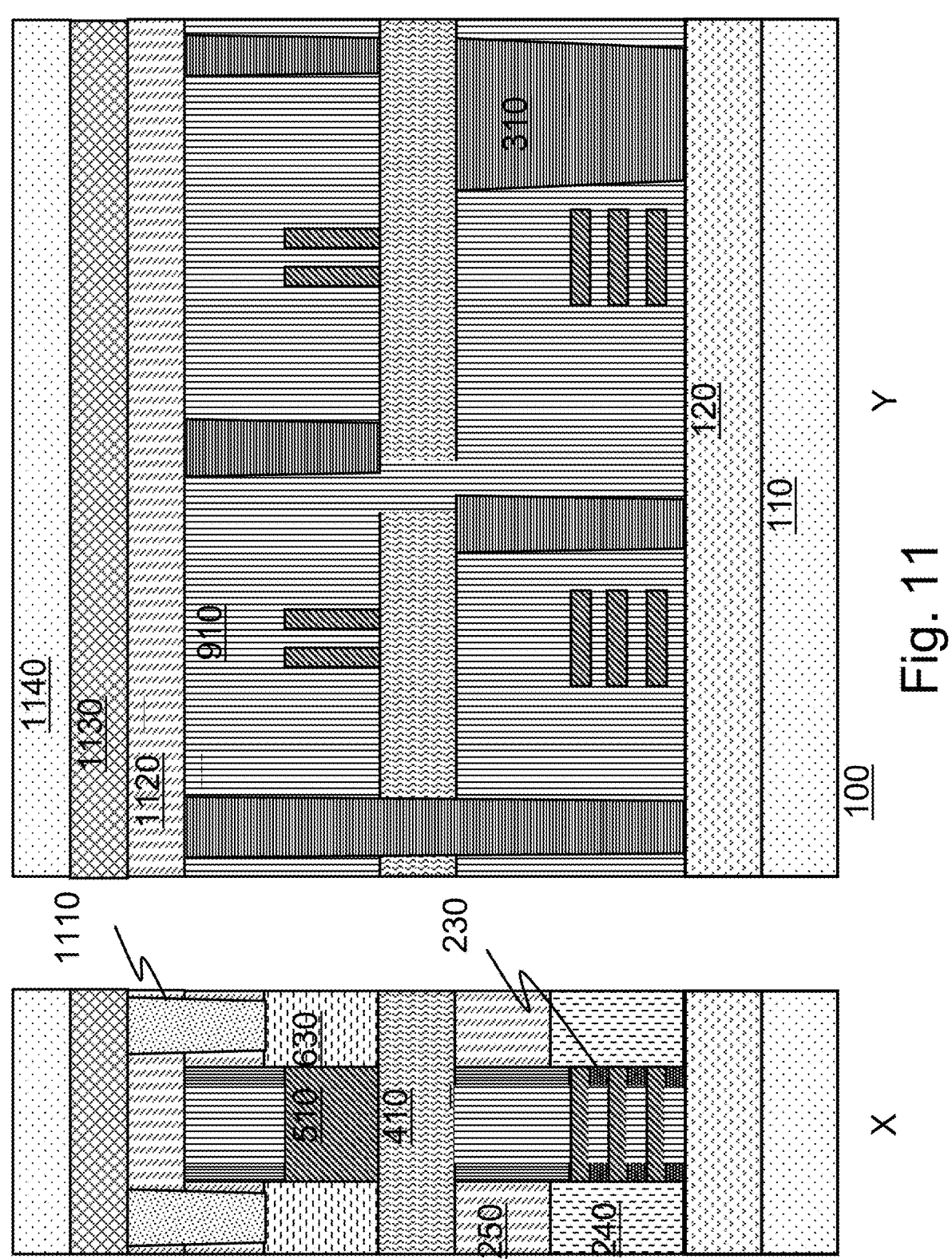
FIG. 11 provides cross-sectional views of a step in the fabrication of a semiconductor device, according to an embodiment of the invention. The figure illustrates the device after the formation of upper device contacts, BEOL structures, ana carrier wafer.

FIG. 11 illustrates device 100 following formation of device contacts 1110, connecting upper device source-drain regions 630, through ILD layer 1120, as well as formation of the back-end-of-line structure 1130 and bonding a carrier semiconductor wafer 1140. Wafer 1140 comprises a similar material to that of substrate 110. BEOL structure 1130 may comprise additional circuit elements connected to the stacked CMOS devices.

Figure 12:
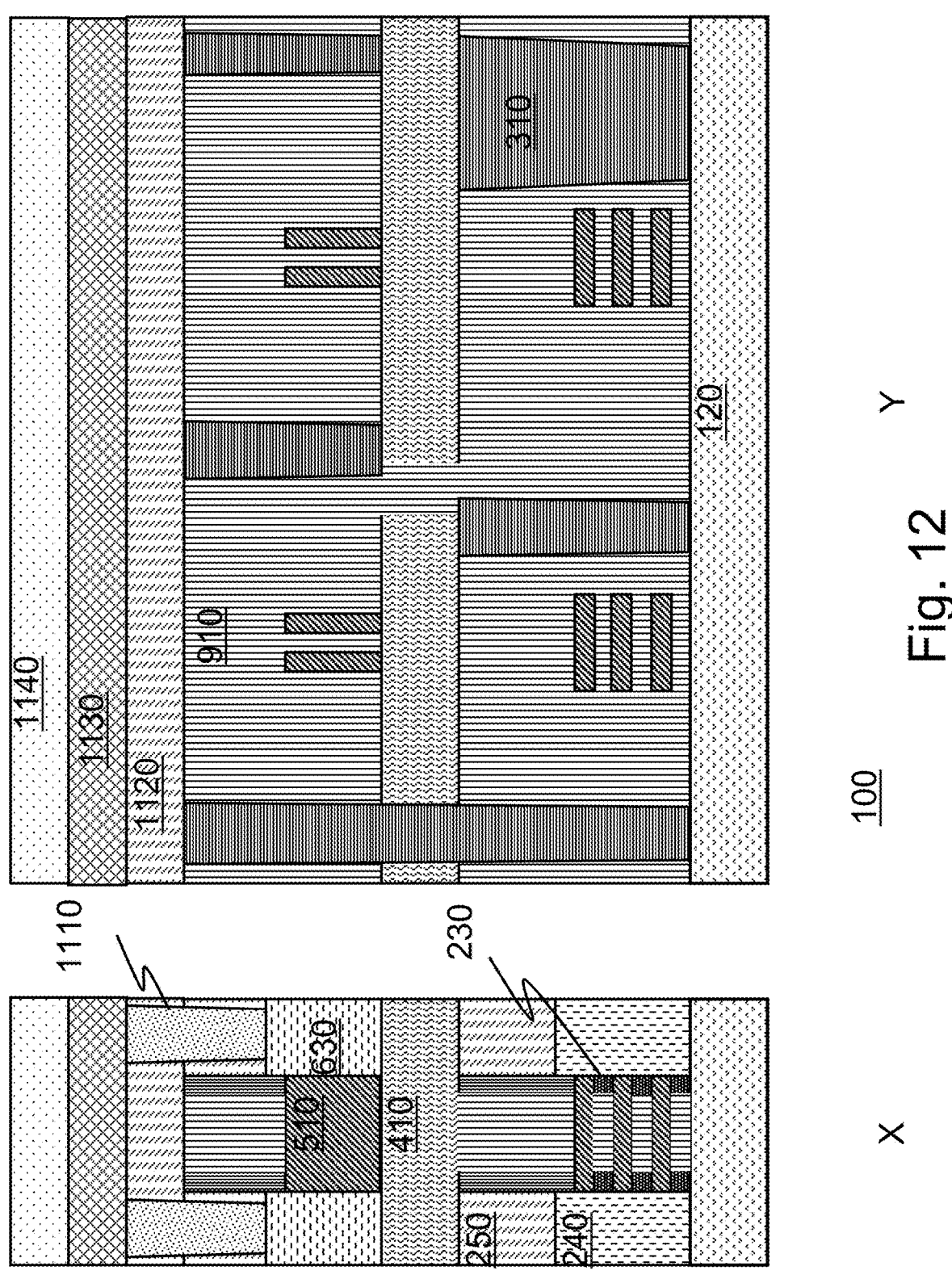
FIG. 12 provides cross-sectional views of a step in the fabrication of a semiconductor device, according to an embodiment of the invention. The figure illustrates the device after inversion and removal of the lower substrate.

FIG. 12 illustrates device 100 following flipping of the overall structure using carrier wafer 1130, as well as following removal of underlying substrate 110 from beneath lower devices of the stacked CMOS structures.

Figure 13:
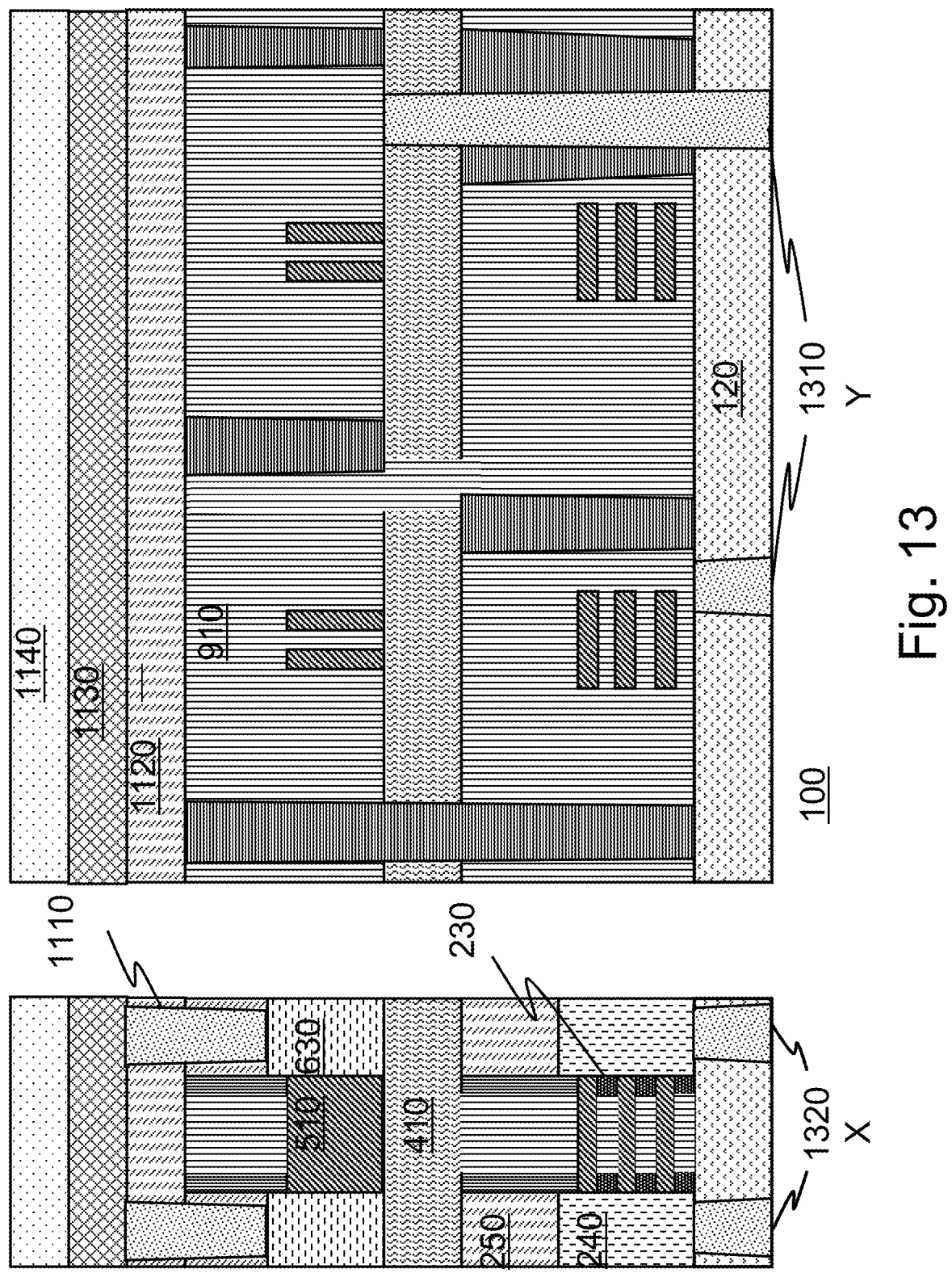
FIG. 13 provides cross-sectional views of a step in the fabrication of a semiconductor device, according to an embodiment of the invention. The figure illustrates the device after formation of lower device contacts.

FIG. 13 illustrates device 100 following formation of backside gate contacts 1310 and backside S/D contacts 1320 for each of an upper and lower FET device of the adjacent stacked CMOS devices.

Figure 14:
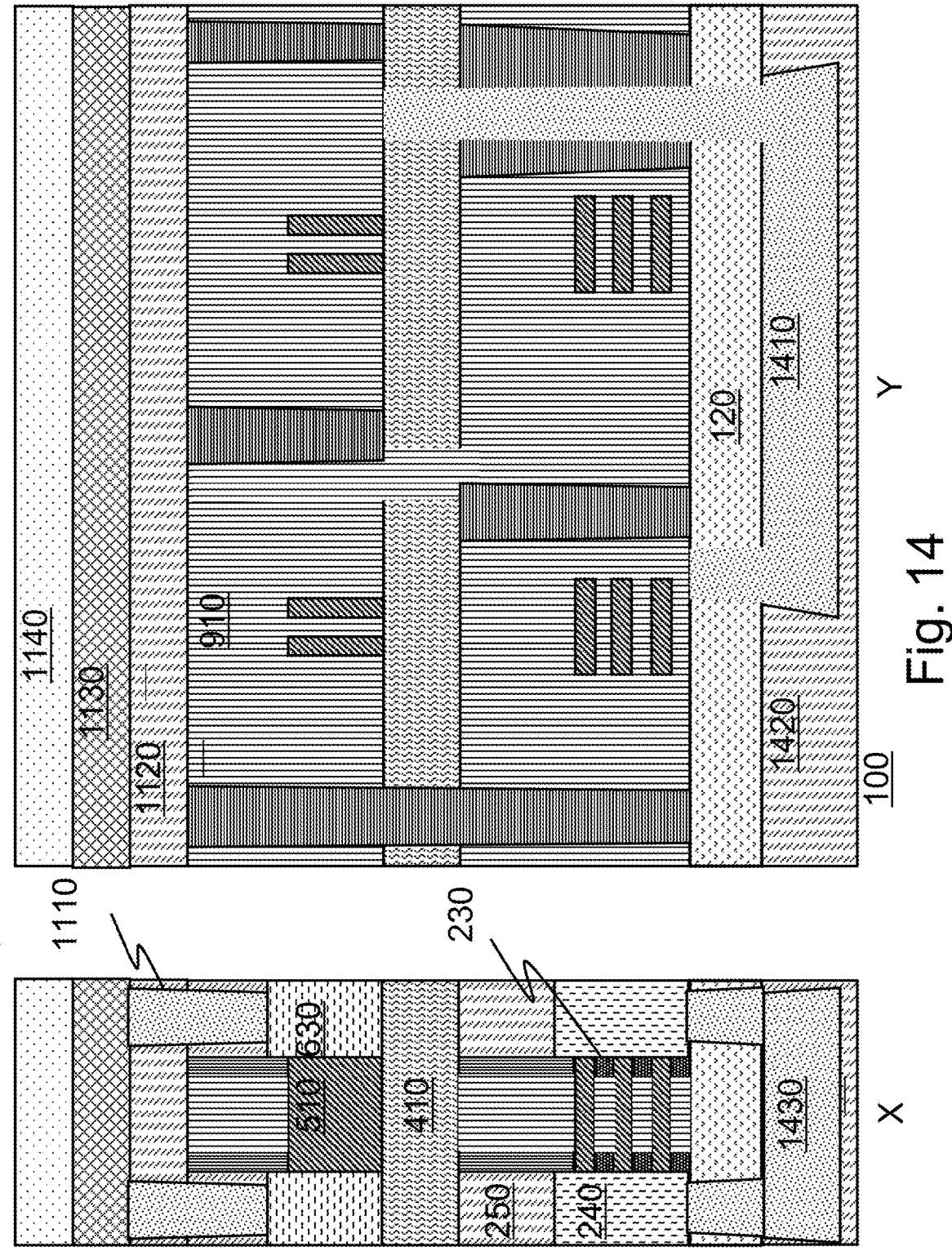
FIG. 14 provides cross sectional views of a step in the fabrication of a semiconductor device, according to an embodiment of the invention. The figure illustrates the device after formation of backside cross-connections between an upper device and lower device.
Figure 15:
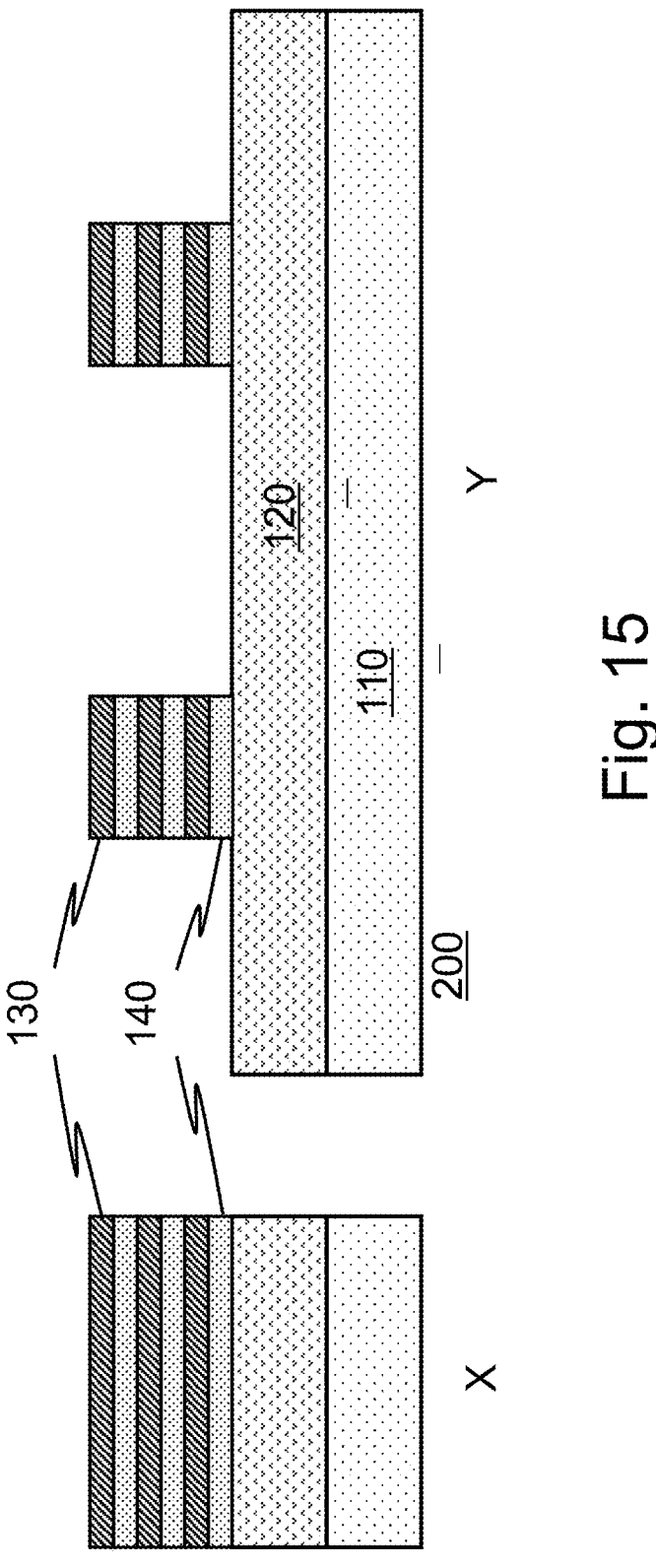
FIG. 15 provides cross-sectional views of a step in the fabrication of a semiconductor device, according to an embodiment of the invention. The figure illustrates a formed and patterned stack of epitaxially grown nanosheet layers.
Figure 16:
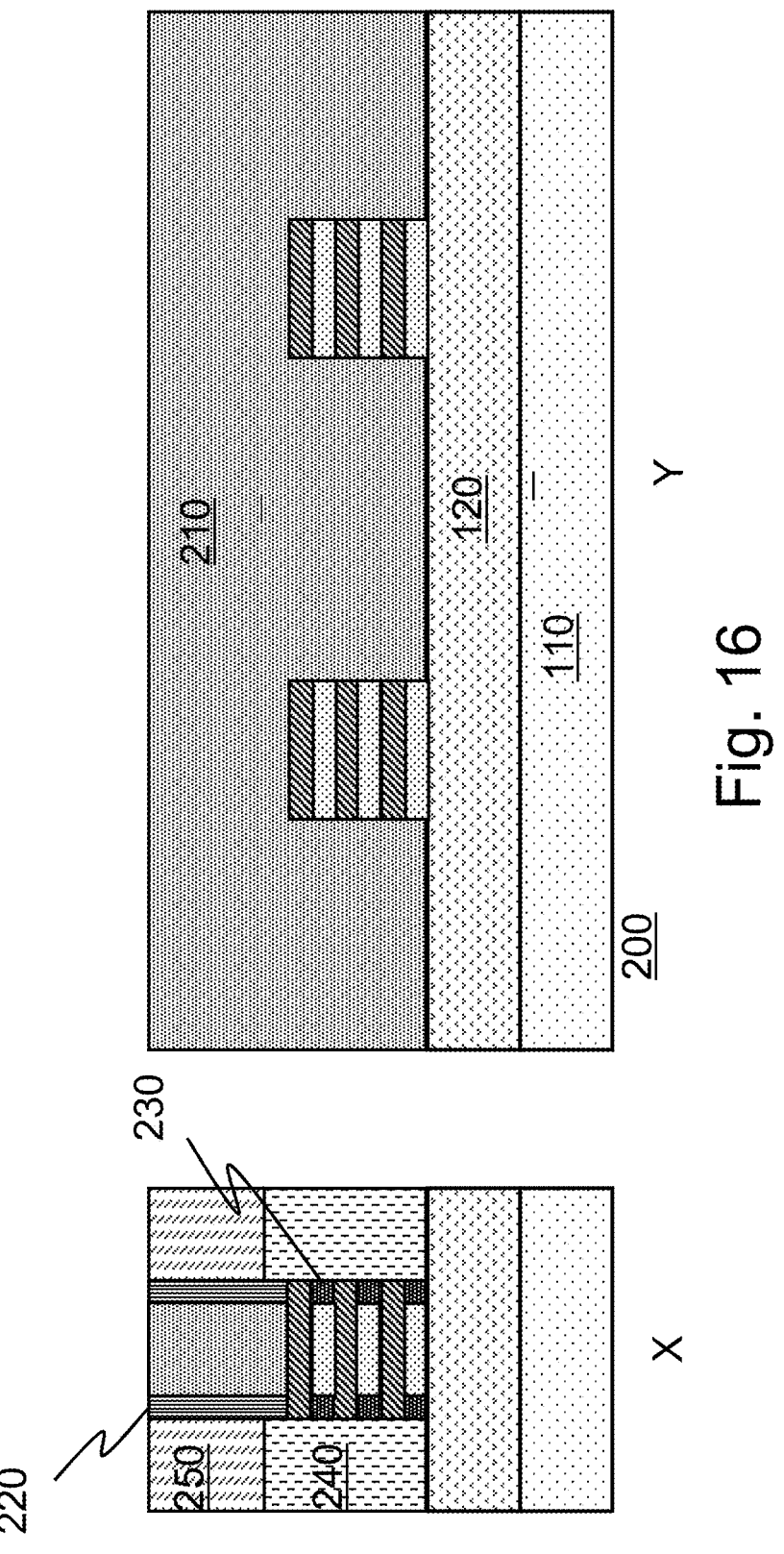
FIG. 16 provides cross-sectional views of a step in the fabrication of a semiconductor device, according to an embodiment of the invention. The figure illustrates the formation of device fins from the stack of nanosheet layers and the formation of source-drain regions and dummy gates.
Figure 17:
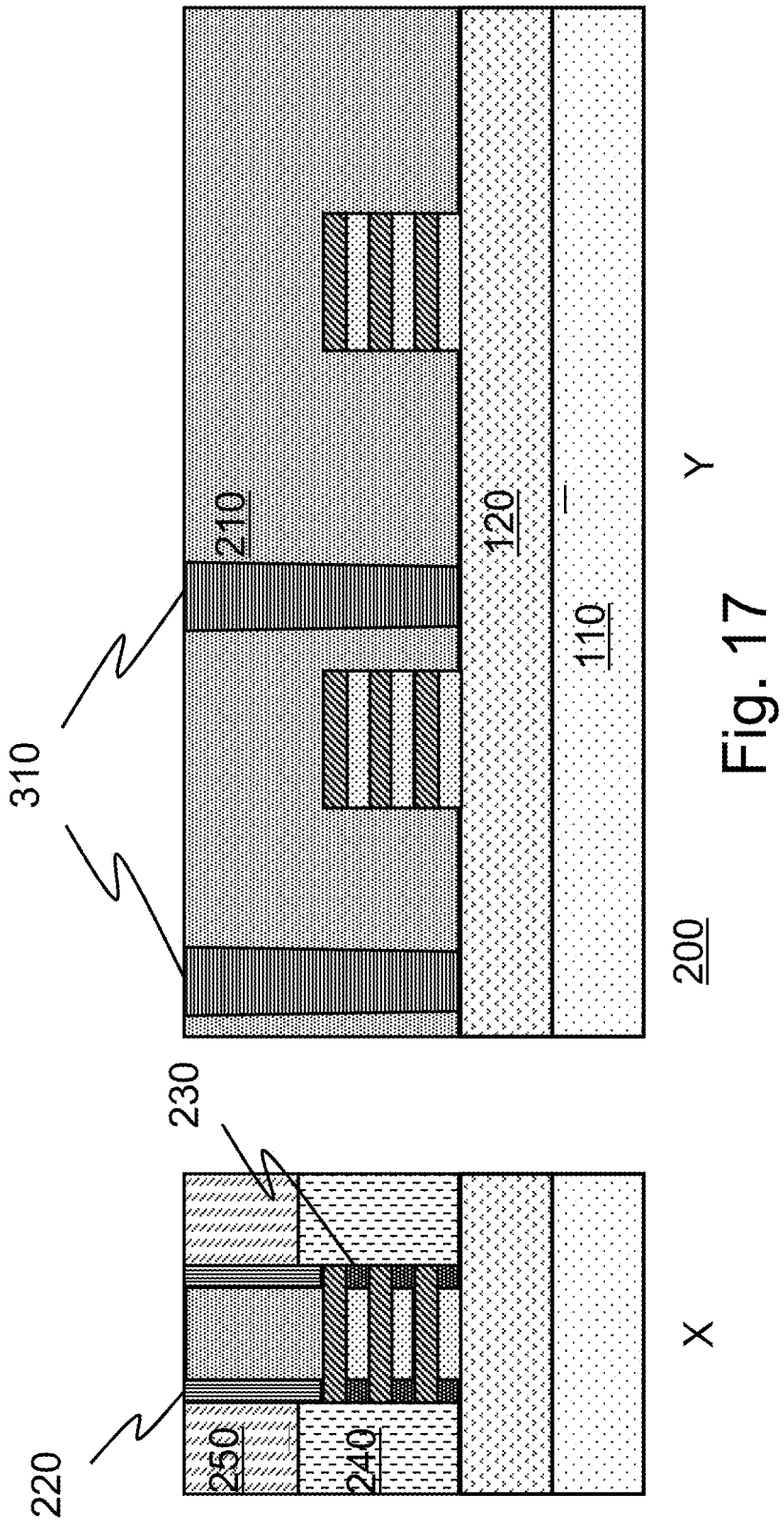
FIG. 17 provides cross-sectional views of a step in the fabrication of a semiconductor device, according to an embodiment of the invention. The figure illustrates formation of gate cuts.
Figure 18:
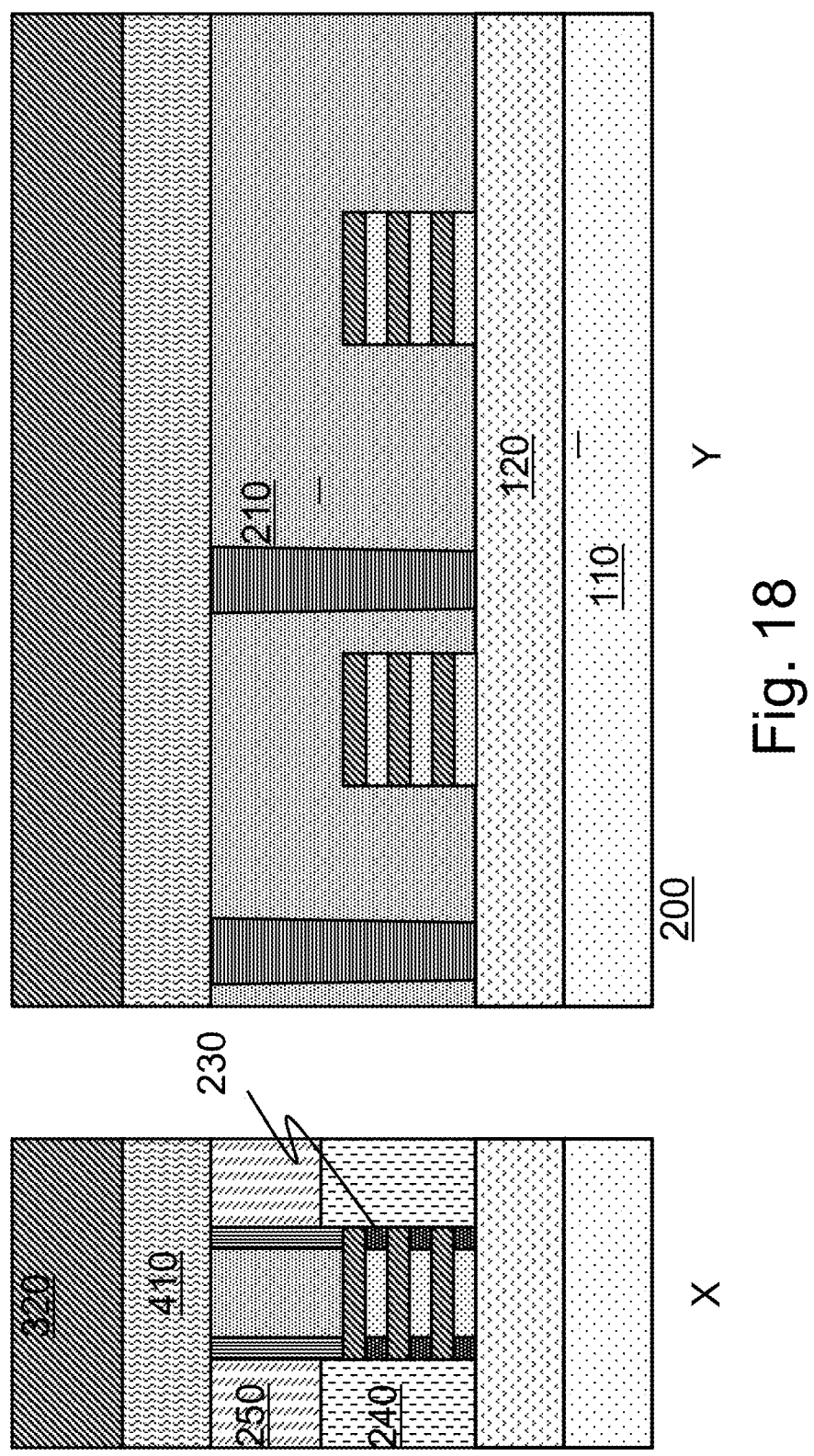
FIG. 18 provides cross-sectional views of a step in the fabrication of a semiconductor device, according to an embodiment of the invention. The figure illustrates the device after the formation of a binding dielectric layer and an upper device semiconductor channel layer.
Figure 19:
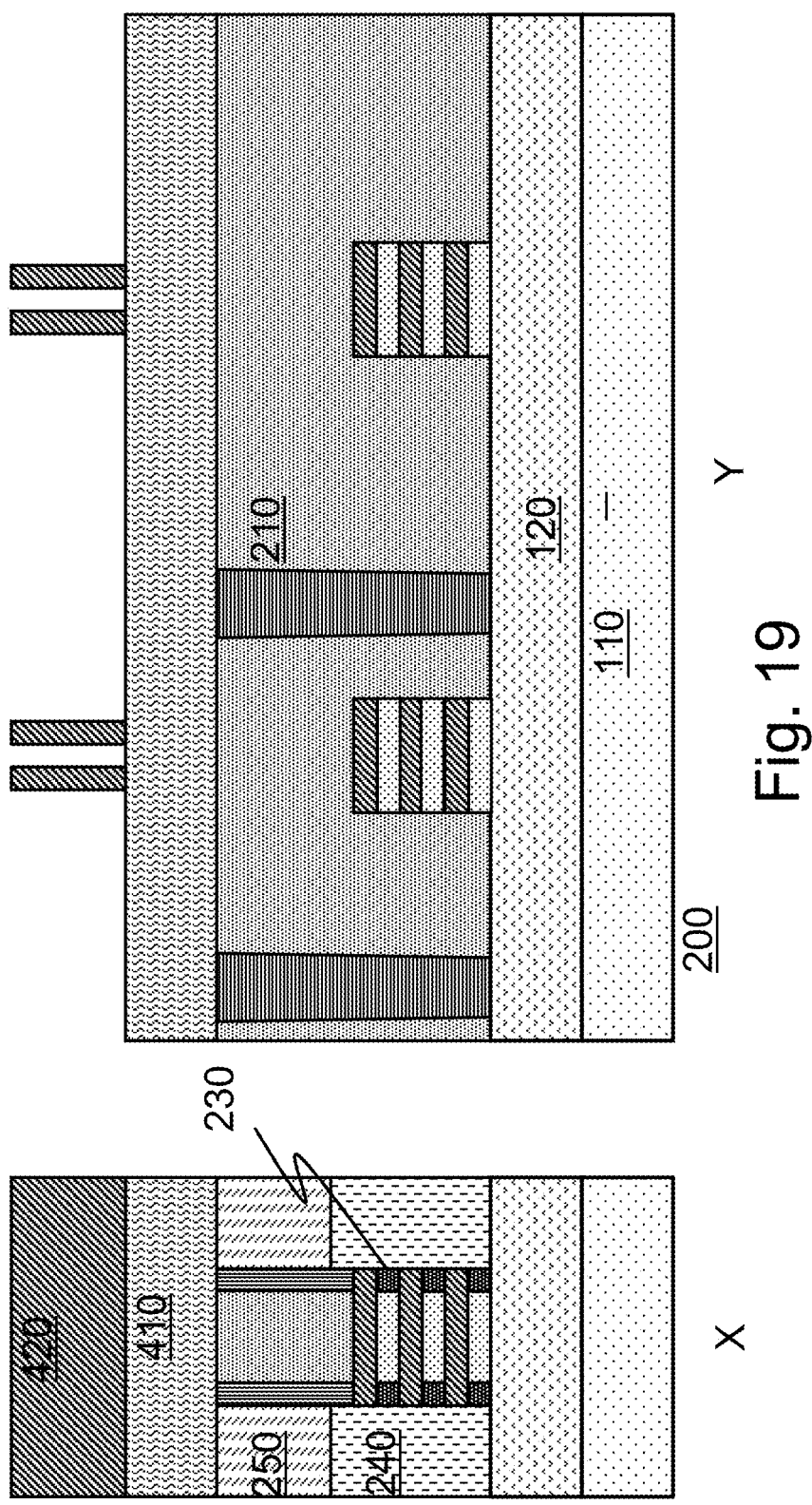
FIG. 19 provides cross-sectional views, of a step in the fabrication of a semiconductor device, according to an embodiment of the invention. The figure illustrates the device after the formation of upper device fins.
Figure 20:
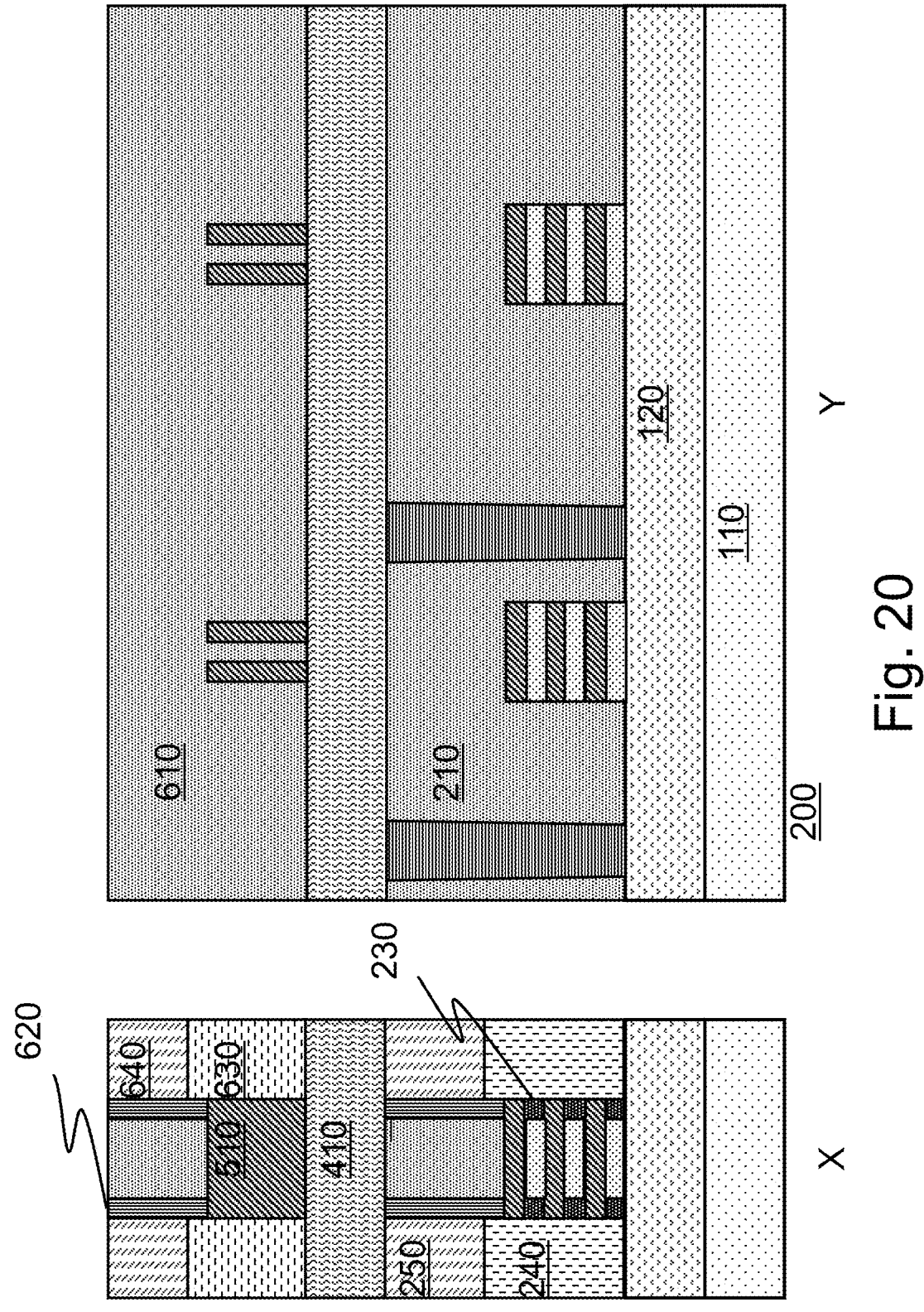
FIG. 20 provides cross-sectional views of a step in the fabrication of a semiconductor device, according to an embodiment of the invention. The figure illustrates the device after the formation of upper device source-drain regions and dummy gates.
Figure 21:
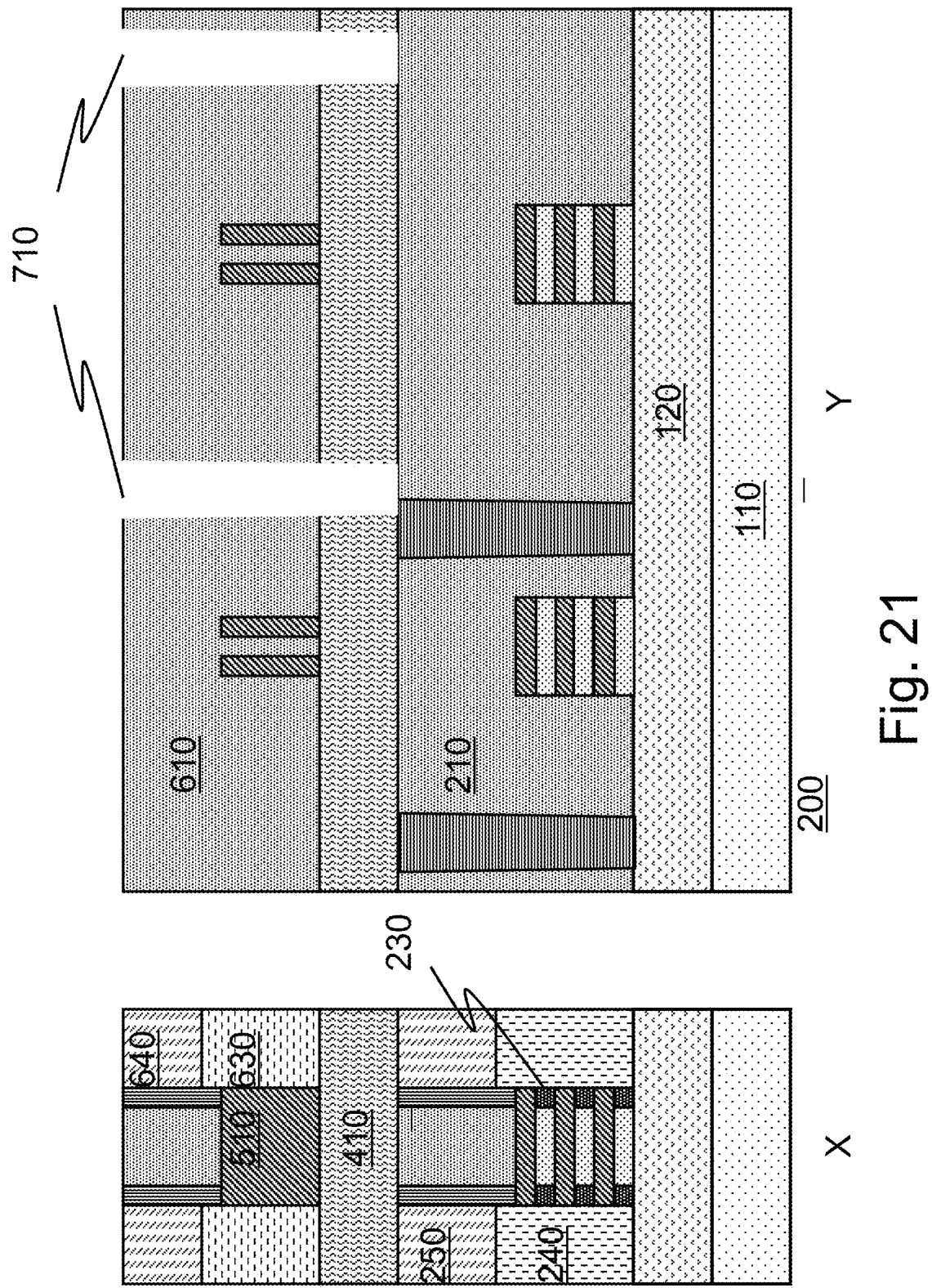
FIG. 21 provides cross-sectional views of a step in the fabrication of a semiconductor device, according to an embodiment of the invention. The figure illustrates the device after the formation of upper-lower device gate cuts.
Figure 22:
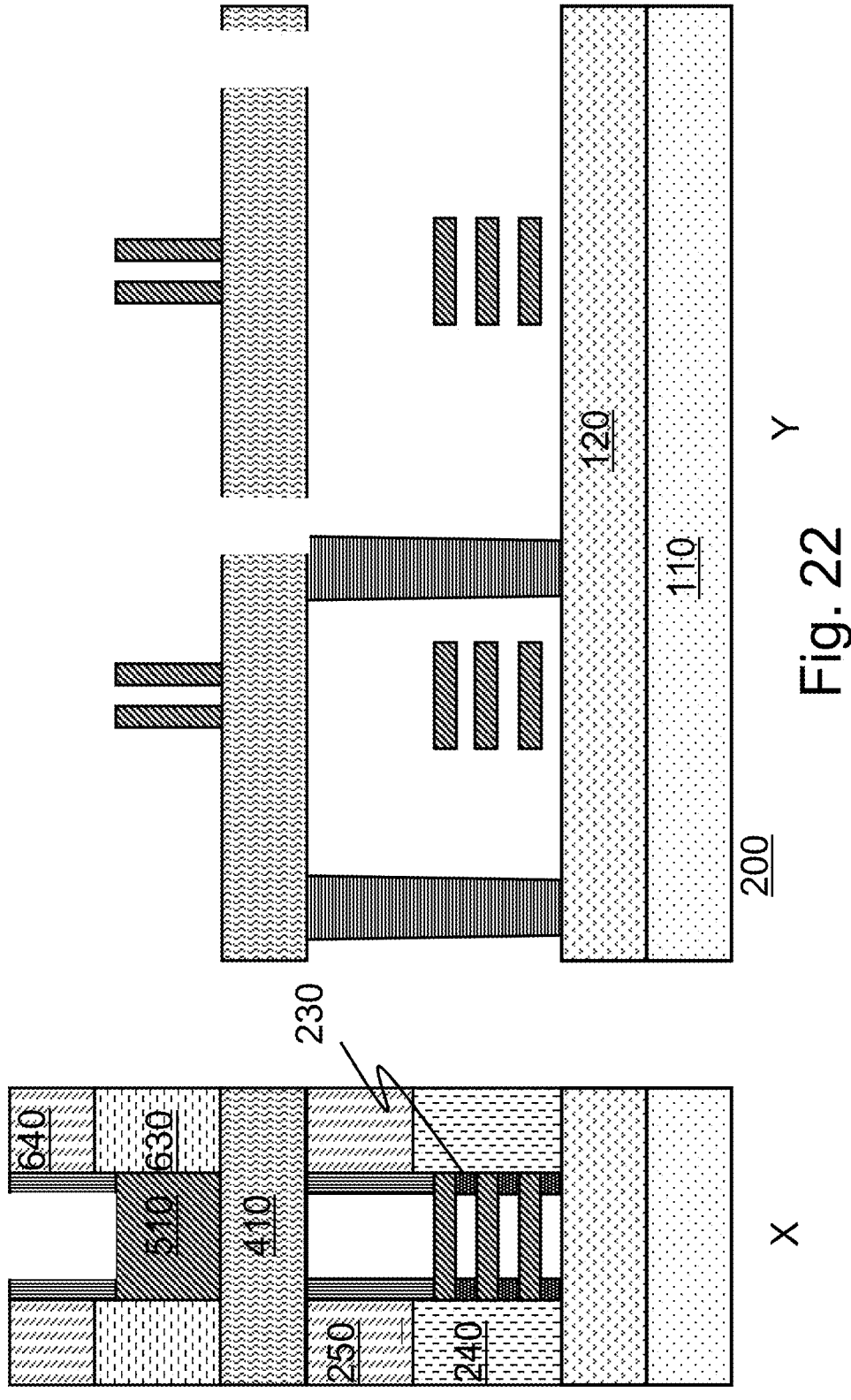
FIG. 22 provides cross-sectional views of a step in the fabrication of a semiconductor device, according to an embodiment of the invention. The figure illustrates the device after the release and removal of dummy gate materials.
Figure 23:
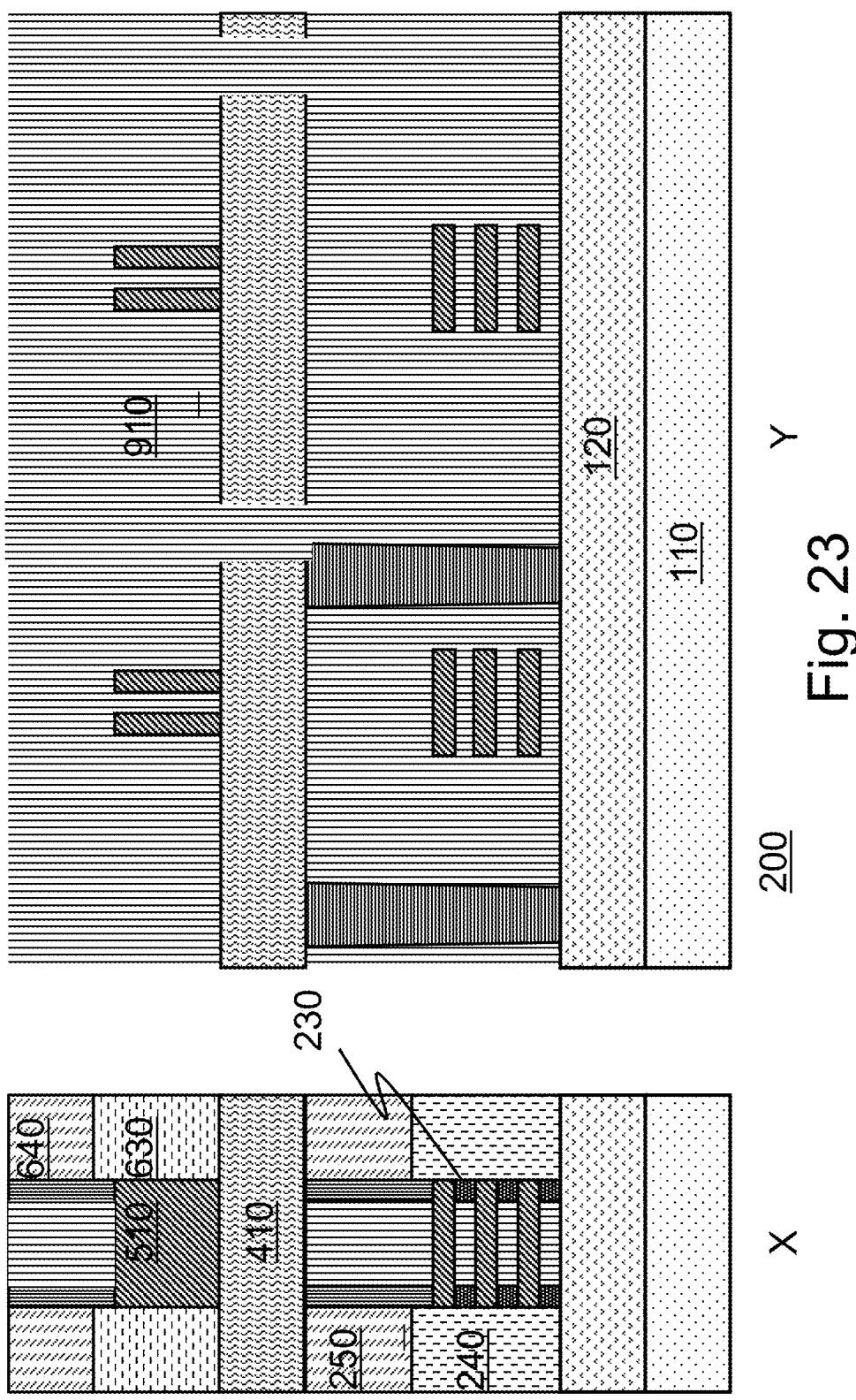
FIG. 23 provides cross-sectional views of a step in the fabrication of a semiconductor device, according to an embodiment of the invention. The figure illustrates the device after formation of high-k replacement metal gates.
Figure 24:
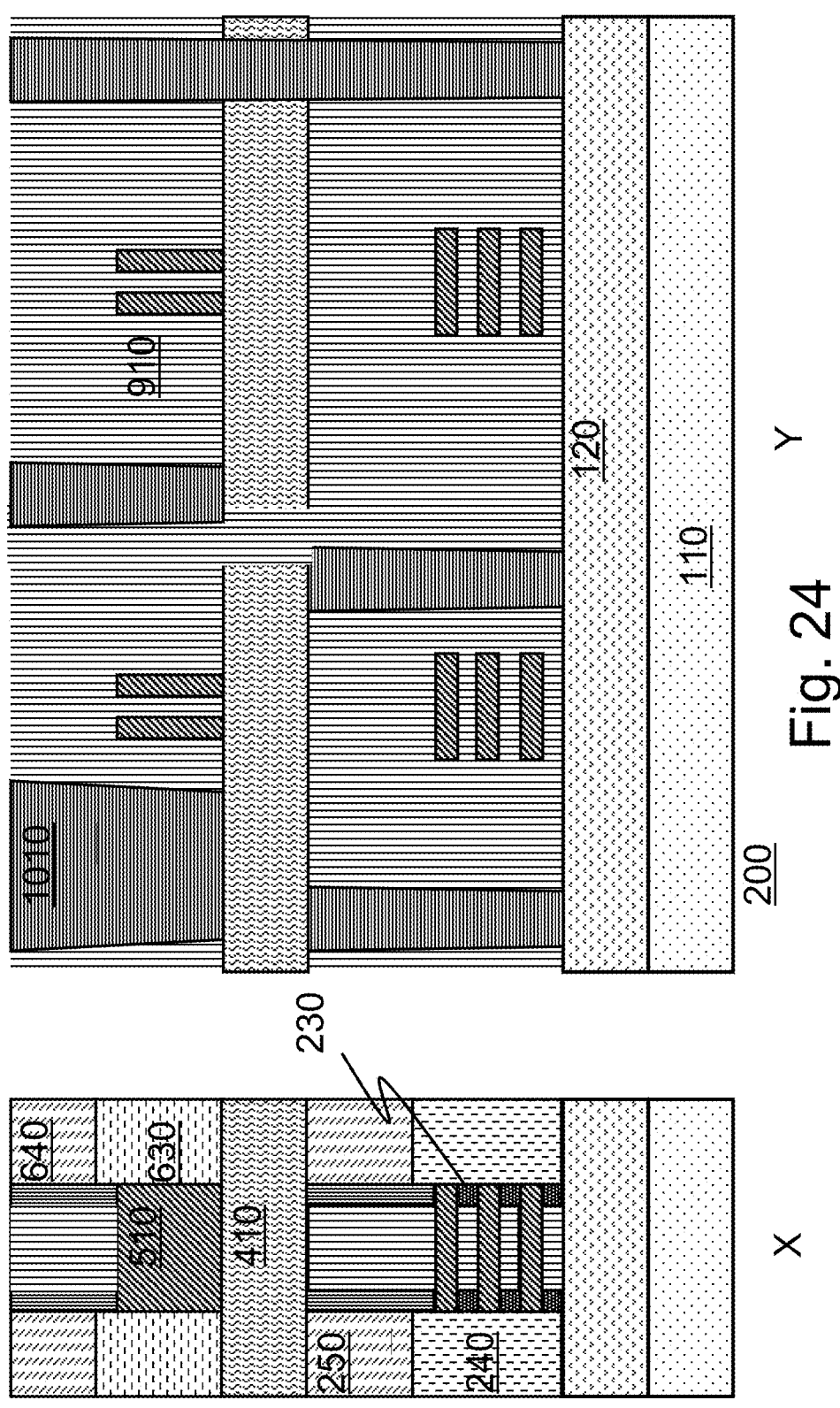
FIG. 24 provides cross-sectional views of a step in the fabrication of a semiconductor device, according to an embodiment of the invention. The figure illustrates the device after formation of upper-lower device gate cuts.

FIG. 14 illustrates device 100 following formation of backside interconnect level 1410, in ILD layer 1420, to form the inter-device cross-connection between an upper device of one CMOS gate stack and a lower device of an adjacent CMOS gate stacks. The Figure further illustrates device 100 following forming additional backside interconnect 1430 over the backside S/D contacts 1320.

Figure 25:
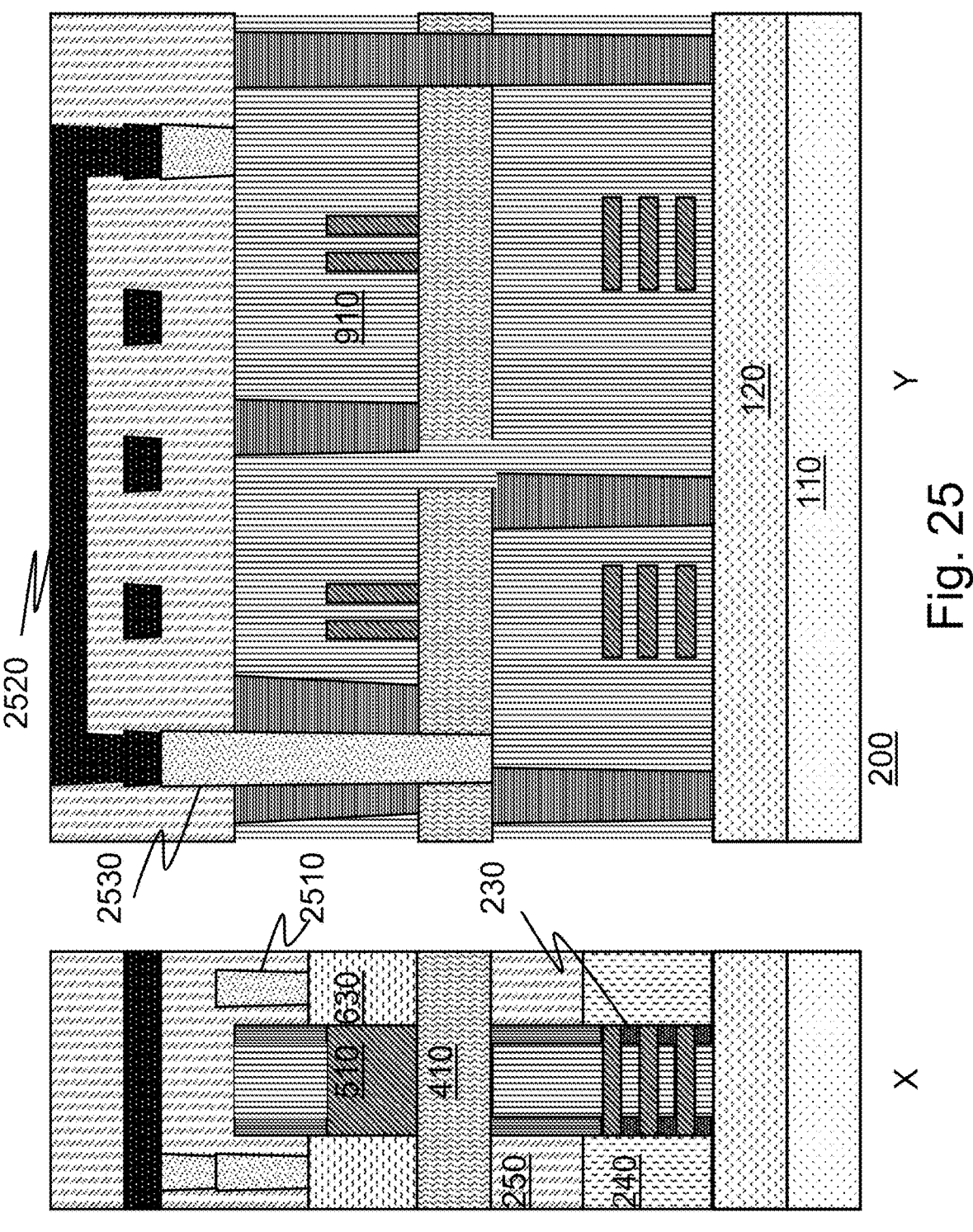
FIG. 25 provides cross-sectional views of a step in the fabrication of a semiconductor device, according to an embodiment of the invention. The figure illustrates the device after the formation of upper device contacts, and front side cross-connections between upper and lower devices.

FIG. 15-25 illustrate fabrication of an alternative embodiment of a device according to the invention. Fabrication proceeds in a manner similar to that described with respect t to FIGS. 1B-10 above, with the noted difference in the locations of gate cuts in FIG. 17 relative to FIG. 3, as contacts in this second embodiment route through differing portions of the overall device. Further, the gate cut locations of FIG. 24 differ from those of FIG. 10 for the same reason. FIG. 25 illustrates device 200 following formation of upper and lower device contacts 2510 as well as formation of the upper device-lower device cross-connection 2520 via a BEOL structure connecting upper and lower device contacts 2530.

Figure 26:
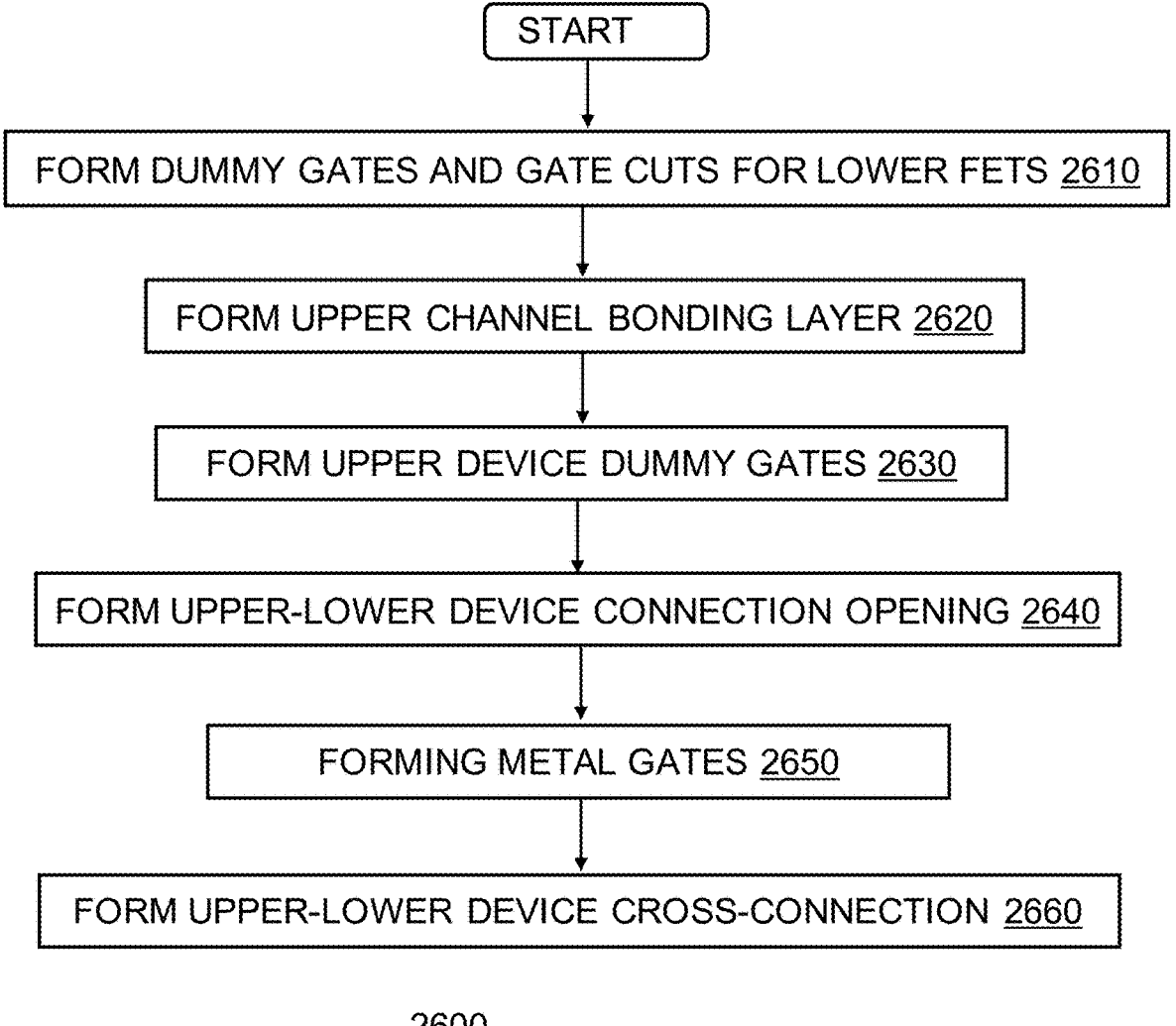
FIG. 26 provides a flowchart depicting operational steps for forming semiconductor device, according to an embodiment of the invention.

FIG. 26 depicts a fabrication process flowchart 2600, according to an embodiment of the invention. As shown in flowchart 2600, at block 2610, the method forms lower FET gate structures. Stacks of alternating nanosheet layers of differing semiconductor materials are epitaxially grown upon an underlying substrate, or upon an insulating layer disposed upon a substrate. The stacks include sacrificial layers and channel layers. The channel layers form the nanosheet channels of the lower FETs of the stacked CMOS. The layers are patterned and etched to form fins upon the underlying substrate. Dummy gate structures including gate sidewall spacers are added atop and along the fins. The nanosheet layers are recessed to align with the dummy gate spacers and inner spacers between nanosheet channel layers are formed to isolate the gates from the S/D regions of the devices. The method grows S/D regions for the lower FET devices.

At block 2620, the method forms a continuous dielectric separation layer between upper and lower FET devices. The dielectric separator may comprise a composite of dielectric elements disposed continuously between upper and lower devices. Portions of the dielectric separator may be selectively removed to enable connections between stacked FET devices.

At block 2630, the method forms upper FET dummy gate structures including gate sidewall spacers and grows upper FET S/D regions.

At block 2640, the method forms connections openings between upper and lower devices through the dielectric separation layer.

At block 2650, the method forms high-k metal gates, replacing the upper and lower dummy gate structures, and sacrificial SiGe layers between nanosheet channels.

At block 2660, the method forms S/D and gate contacts for the upper and lower FETs of the stacked CMOS device. Metal contacts fill vias formed in interlayer dielectric layers encapsulating the bottom FET devices. The method forms cross-connections between upper and lower FETs. In an embodiment, the method forms back-end-of line, or backside, cross-connections between upper and lower FETs of adjacent stacked CMOS pairs. In an embodiment, the method forms frontside, or front-end-of-line, cross-connections between upper and lower FETs of adjacent stacked CMOS pairs.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a first pair of stacked transistors comprising a first upper transistor and a first lower transistor, the first lower transistor comprising a first nanosheet stack;
a second pair of stacked transistors comprising a second upper transistor and a second lower transistor, the second lower transistor comprising a second nanosheet stack; and
a first cross-connection between a gate of the first upper transistor and a gate of the second lower transistor.

2. The semiconductor device according to claim 1, further comprising a second cross-connection between the gate of the first lower transistor and the gate of the second upper transistor.

3. The semiconductor device according to claim 1, wherein the first upper transistor is a first FET (field effect transistor) and the second lower transistor is a second FET, and wherein the first cross-connection forms a first gate connecting the first FET to the second FET.

4. The semiconductor device according to claim 1, wherein the first upper transistor is NFET and the second lower transistor is PFET.

5. The semiconductor device according to claim 1, wherein the first upper transistor is PFET and the second lower transistor is NFET.

6. The semiconductor device according to claim 1, wherein the first cross-connection comprises a front side connection.

7. The semiconductor device according to claim 1, wherein the first cross-connection comprises a back side connection.

\* \* \* \* \*